(12) United States Patent
Chung et al.

(10) Patent No.: US 9,812,329 B2
(45) Date of Patent: Nov. 7, 2017

(54) METHOD OF FABRICATING A SEMICONDUCTOR DEVICE

(71) Applicant: Samsung Electronics Co., Ltd., Suwon-si (KR)

(72) Inventors: Won Woong Chung, Suwon-si (KR); Youn Joung Cho, Hwaseong-si (KR); Jung Sik Choi, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/291,268

(22) Filed: Oct. 12, 2016

(65) Prior Publication Data
US 2017/0170023 A1    Jun. 15, 2017

(30) Foreign Application Priority Data

Dec. 10, 2015    (KR) .................. 10-2015-0175567

(51) Int. Cl.
| | | |
|---|---|---|
| H01L 21/285 | (2006.01) | |
| H01L 21/786 | (2006.01) | |
| H01L 21/8238 | (2006.01) | |
| H01L 21/768 | (2006.01) | |

(52) U.S. Cl.
CPC .. *H01L 21/28518* (2013.01); *H01L 21/76895* (2013.01); *H01L 21/823871* (2013.01); *H01L 21/823878* (2013.01)

(58) Field of Classification Search
CPC ......... H01L 21/28518; H01L 21/76895; H01L 21/823878; H01L 21/823871
See application file for complete search history.

(56) References Cited

U.S. PATENT DOCUMENTS

| | | |
|---|---|---|
| 6,417,105 B1 | 7/2002 | Shah et al. |
| 6,838,375 B2 | 1/2005 | Hu |
| 7,297,642 B2 | 11/2007 | Gao et al. |
| 7,528,070 B2 | 5/2009 | Han |
| 9,312,376 B2 | 4/2016 | Kim et al. |
| 2007/0187758 A1 | 8/2007 | Jun et al. |
| 2008/0020568 A1* | 1/2008 | Jang .................. H01L 21/28518 438/664 |
| 2008/0029912 A1 | 2/2008 | Jeon |

(Continued)

FOREIGN PATENT DOCUMENTS

| | | |
|---|---|---|
| JP | 2010-168607 | 8/2010 |
| JP | 2012-069663 | 4/2012 |

(Continued)

*Primary Examiner* — Mamadou Diallo
(74) *Attorney, Agent, or Firm* — Muir Patent Law, PLLC

(57) ABSTRACT

There is provides a method of fabricating a semiconductor device to decrease contact resistance of source/drain regions and gate electrodes and thereby improve operation performance. The method includes providing an exposed silicon region, forming a rare earth metal silicide film on the exposed silicon region, the rare earth metal silicide film contacting the silicon region, and forming a contact on the rare earth metal silicide film, the contact being electrically connected to the exposed silicon region, wherein the rare earth metal silicide film is formed by simultaneously supplying a rare earth metal and silicon to the exposed silicon region using physical vapor deposition.

20 Claims, 25 Drawing Sheets

(56) References Cited

U.S. PATENT DOCUMENTS

| | | | | |
|---|---|---|---|---|
| 2010/0052166 A1* | 3/2010 | Mukherjee | ........ | H01L 21/28518 257/741 |
| 2010/0155954 A1* | 6/2010 | Mukherjee | ........ | H01L 21/76814 257/754 |
| 2011/0198702 A1* | 8/2011 | Ohmi | ................ | H01L 21/28079 257/369 |
| 2012/0112292 A1* | 5/2012 | Lavoie | .............. | H01L 21/28518 257/408 |
| 2013/0049200 A1* | 2/2013 | Besser | .................... | H01L 29/00 257/741 |
| 2013/0189839 A1* | 7/2013 | Guillorn | ......... | H01L 21/823814 438/675 |
| 2014/0299889 A1* | 10/2014 | Cho | ..................... | H01L 27/092 257/77 |

FOREIGN PATENT DOCUMENTS

| | | |
|---|---|---|
| JP | 2013-074271 | 4/2013 |
| JP | 2015-086459 | 5/2015 |
| KR | 10-2003-0059460 | 7/2003 |
| KR | 10-0946036 | 2/2010 |
| KR | 10-1122756 | 2/2012 |

* cited by examiner

FIG. 20
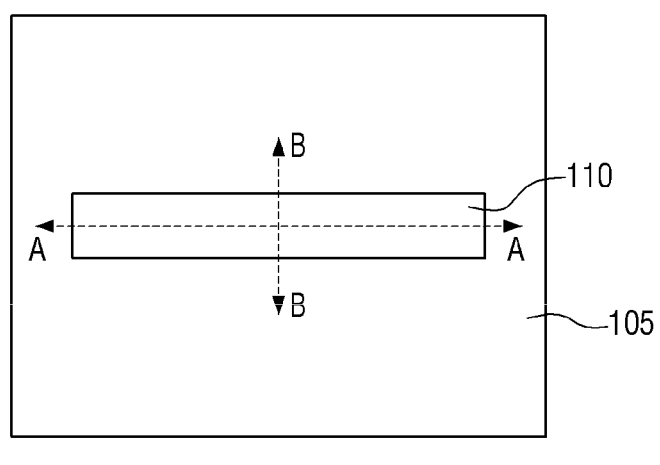
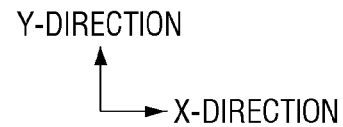

FIG. 21A
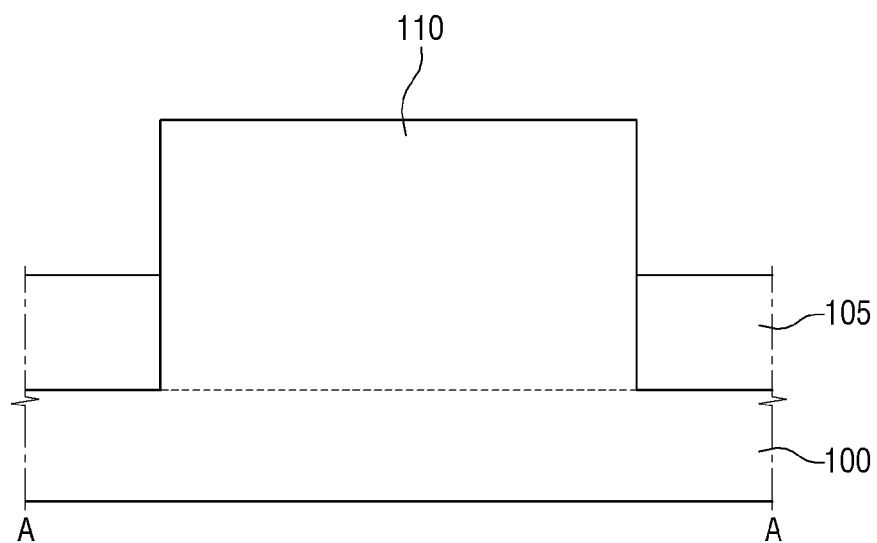
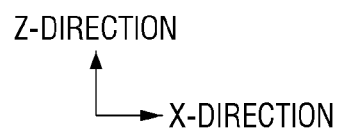

FIG. 21B
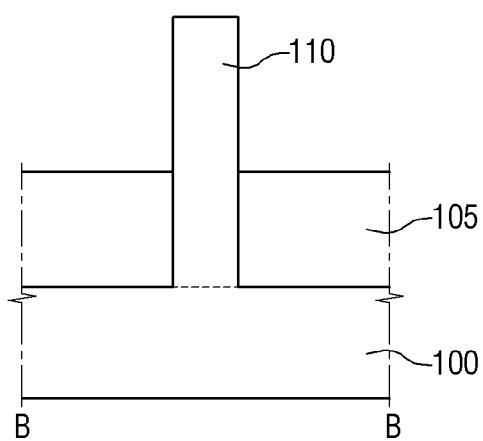
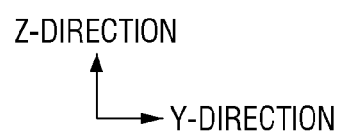

METHOD OF FABRICATING A SEMICONDUCTOR DEVICE

CROSS-REFERENCE TO RELATED APPLICATION

This application claims the benefit of priority under 35 U.S.C. §119 from Korean Patent Application No. 10-2015-0175567, filed on Dec. 10, 2015, in the Korean Intellectual Property Office, the contents of which in its entirety are herein incorporated by reference.

BACKGROUND

1. Technical Field

The present disclosure relates to a method of fabricating a semiconductor device.

2. Description of the Related Art

Research is underway to increase operating speed of semiconductor devices and enhance integration density. The semiconductor devices are equipped with discrete devices such as MOS transistors. Due to continuous integration of semiconductor devices, gates of the MOS transistors are gradually becoming smaller, and underlying channel regions of the gates are also gradually becoming narrower.

In addition, research is underway to improve performance of semiconductor devices by decreasing resistance between source/drain regions and contacts of transistors and resistance between gate electrodes and contacts.

SUMMARY

It is an object of the present disclosure to provide a method of fabricating a semiconductor device to decrease contact resistance of source/drain regions and gate electrodes and thereby improve operation performance.

In some exemplary embodiments, the disclosure is directed to a method of fabricating a semiconductor device comprising: providing an exposed silicon region; forming a rare earth metal silicide film on the exposed silicon region by simultaneously supplying a rare earth metal and a silicon to the exposed silicon region using physical vapor deposition, the rare earth metal silicide film contacting the silicon region; and forming a contact on the rare earth metal silicide film, the contact being electrically connected to the exposed silicon region.

In some exemplary embodiments, the disclosure is directed to a method of fabricating a semiconductor device, comprising: forming a first gate electrode on a substrate; forming a first source/drain region at opposite sides of the first gate electrode; forming a rare earth metal silicide film on the first source/drain region, the rare earth metal silicide film contacting the first source/drain region; and forming a contact on the rare earth metal silicide film, the contact being electrically connected to the first source/drain region, wherein the rare earth metal silicide film is formed by sputtering a deposition target including rare earth metal silicide.

In some exemplary embodiments, the disclosure is directed to a method of fabricating a semiconductor device comprising: forming a first gate electrode on a substrate; forming, at opposite sides of the first gate electrode, a first source/drain region having an exposed silicon region; forming a rare earth metal silicide film on the exposed silicon region by supplying a rare earth metal and a silicon to the exposed silicon region using physical vapor deposition; and forming a contact on the rare earth metal silicide film, the contact being electrically connected to the exposed silicon region via the rare earth metal silicide film.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which:

FIGS. 20 to 22 are views provided to explain a method of fabricating a semiconductor device according to some exemplary embodiments.

DETAILED DESCRIPTION

Figure 1:
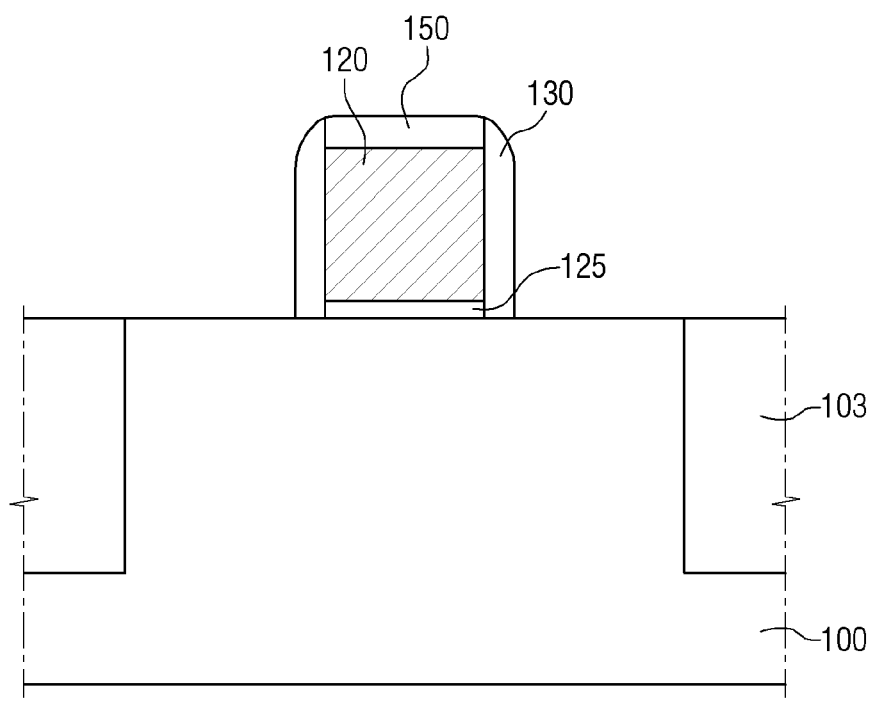
FIGS. 1 to 6 are views illustrating intermediate stages of fabrication, provided to explain a method for fabricating a semiconductor device according to some exemplary embodiments.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other may be electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.). The term "contact," as used herein, refers to a direct connection (i.e., touching) unless the context indicates otherwise.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Hereinbelow, a method of fabricating a semiconductor device according to some exemplary embodiments will be explained with reference to FIGS. 1 to 6 and FIGS. 29 to 31.

Figure 29:
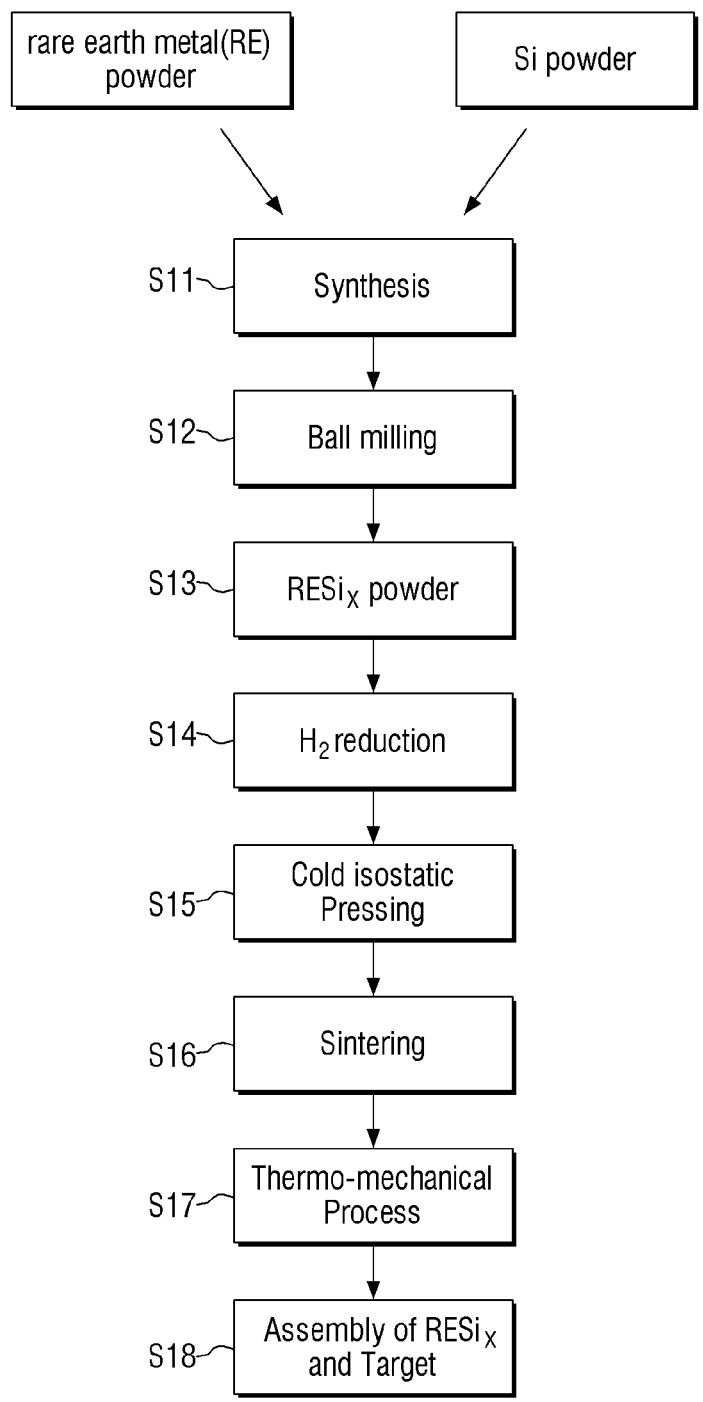
FIG. 29 is a view provided to explain a method of forming a rare earth metal silicide deposition target according to some exemplary embodiments.
Figure 30:
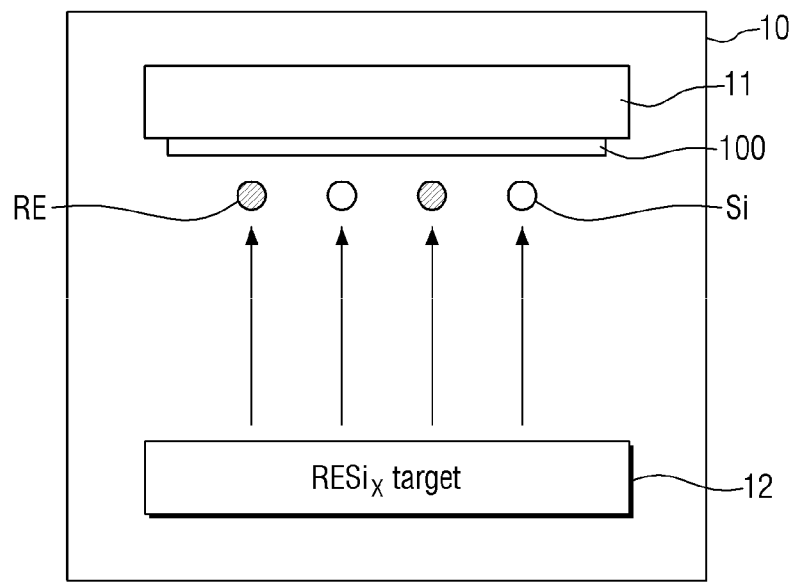
FIG. 30 is a view provided to explain deposition of a rare earth metal silicide film using the rare earth metal silicide deposition target.
Figure 31:
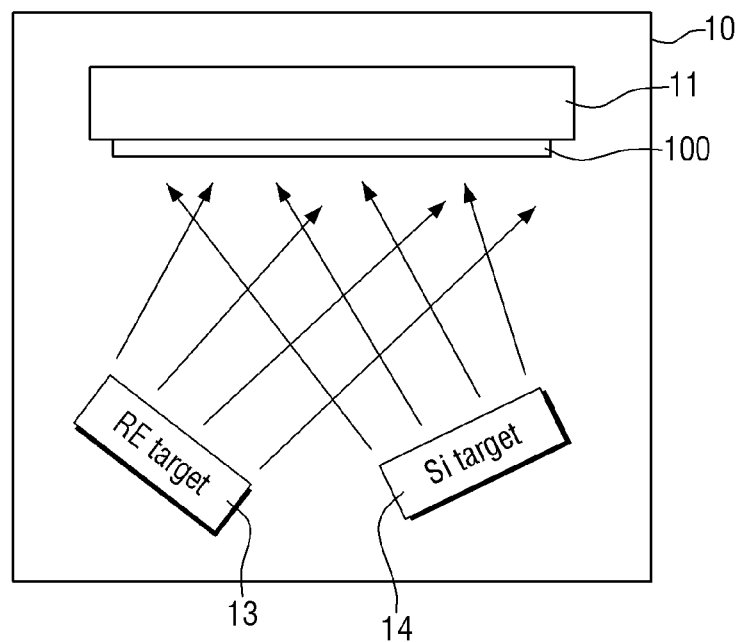
FIG. 31 is a view provided to explain deposition of a rare earth metal silicide film using the rare earth metal deposition target and a silicon deposition target.

FIGS. 1 to 6 are views illustrating intermediate stages of fabrication, provided to explain a method of fabricating a semiconductor device according to some exemplary embodiments. FIG. 29 is a view provided to explain a method of forming a rare earth metal silicide deposition target according to some exemplary embodiments. FIG. 30 is a view provided to explain depositing a rare earth metal silicide film using the rare earth metal silicide deposition target. FIG. 31 is a view provided to explain depositing a rare earth metal silicide film using the rare earth metal deposition target and a silicon deposition target.

The drawings regarding a method of fabricating a semiconductor device according to some exemplary embodiments exemplify a method for forming a planar transistor, but are not limited thereto. The method of fabricating a semiconductor device according to some exemplary embodiments may be used in connection with fabricating a semiconductor device having a variety of structures such as buried channel array transistors (BCATs) or recess channel array transistors (RCATs).

Further, the semiconductor device fabricated using the exemplary method for fabricating a semiconductor device, according to some exemplary embodiments, may include a bipolar junction transistor, a laterally diffused metal oxide semiconductor (LDMOS) transistor, etc.

Referring to FIG. 1, a first gate insulating film 125, a first gate electrode 120, and a first gate hard mask 150 may be formed on a substrate 100 such that they are sequentially stacked thereon. In addition, a first gate spacer 130 may be formed on a sidewall of the first gate electrode 120. The first gate electrode 120, the first gate insulating film 125, and the first gate hardmask 150, collectively, form a first gate stack structure 120, 125, and 150.

More specifically, a device isolation film 103 may be formed within the substrate 100. The device isolation film 103 may be formed to have a shallow trench isolation (STI) structure. In some embodiments, the device isolation film 103 may have relatively high device isolation properties and may occupy a relatively small area, but the embodiments are not limited thereto.

For example, the device isolation film 103 may include one of silicon oxide, silicon oxynitride, silicon nitride, and a combination thereof.

Next, for example, an insulating film (not shown), an electrode film (not shown), and a hard mask film (not shown) may be sequentially formed on the substrate 100. A mask pattern for forming the first gate stack structure 120, 125, and 150 may be formed on the hard mask film. The first gate stack structure 120, 125, and 150 may be formed on the substrate 100 by etching using the mask pattern as a mask.

Meanwhile, after forming the first gate hard mask 150 using the mask pattern, the first gate electrode 120 and the first gate insulating film 125 may be formed using the first gate hard mask 150 as a mask, such that the first gate stack structure 120, 125 and 150 may be formed.

Next, a spacer film may be formed on the substrate 100 such that it covers the first gate stack structure 120, 125 and 150. For example, the first gate spacer 130 may be formed on opposite sidewalls of the first gate electrode 120, formed on opposite sidewalls of the first gate insulating film 125, and formed on opposite sidewalls of the first gate hardmask 150. In addition, a first gate spacer 130 may be formed on sidewalls of the first gate stack structure 120, 125 and 150 by directionally etching the spacer film.

The substrate 100 may be a bulk silicon or a silicon-on-insulator (SOI). Alternatively, the substrate 100 may be a silicon substrate, or may include another substance such as, for example, silicon germanium, silicon germanium on insulator (SGOI), indium antimonide, lead telluride, indium arsenide, indium phosphide, gallium arsenide, or gallium antimonide, but not limited thereto. In the following exemplary description, the substrate 100 is a silicon substrate.

The first gate insulating film 125 may be, for example, a silicon oxide film, an SiON film, a $Ge_xO_yN_z$, $Ge_xSi_yO_z$ film, a high-k dielectric film, or a combination thereof, or a stack film in which these are sequentially stacked. For example, the high-k dielectric film may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but the embodiments are not limited thereto.

The first gate insulating film 125 may be formed by using, for example, thermal treatment, chemical substance treatment, atomic layer deposition (ALD) or chemical vapor deposition (CVD), and so on. In a case where the first gate insulating film 125 includes a high-k dielectric, a first barrier film may be further formed between the first gate insulating film 110 and the first gate electrode 120. The barrier film may include, for example, at least one of titanium nitride (TiN), tantalum nitride (TaN), and a combination thereof.

The first gate electrode 120 may include, for example, one of polycrystalline silicon (poly Si), amorphous silicon (a-Si), titanium (Ti), titanium nitride (TiN), tantalum nitride (TaN), aluminum (Al), or a combination thereof. The poly Si may be formed by using, for example, the CVD, and the a-Si may be formed by using, for example, sputtering, CVD, plasma deposition, and so on, although exemplary embodiments are not limited thereto.

For example, the first gate spacer 130 may include a silicon nitride film, a silicon oxynitride film, a silicon oxide film, or a silicon oxycarbonitride (SiOCN) film. The first gate spacer 130 may be formed by using, for example, CVD or the like. The first gate spacer 130 is formed as a single layer, as illustrated, but the embodiments are not limited thereto and may be formed as a multi-layer.

The first gate hard mask 150 may include a nitride film, an oxide film and a combination thereof, for example. The first gate hard mask 150 may be formed by using, for example, CVD or the like.

Unlike as shown in FIG. 1, in some exemplary embodiments, the first gate hard mask 150 may be not formed on the first gate electrode 120.

Figure 2:
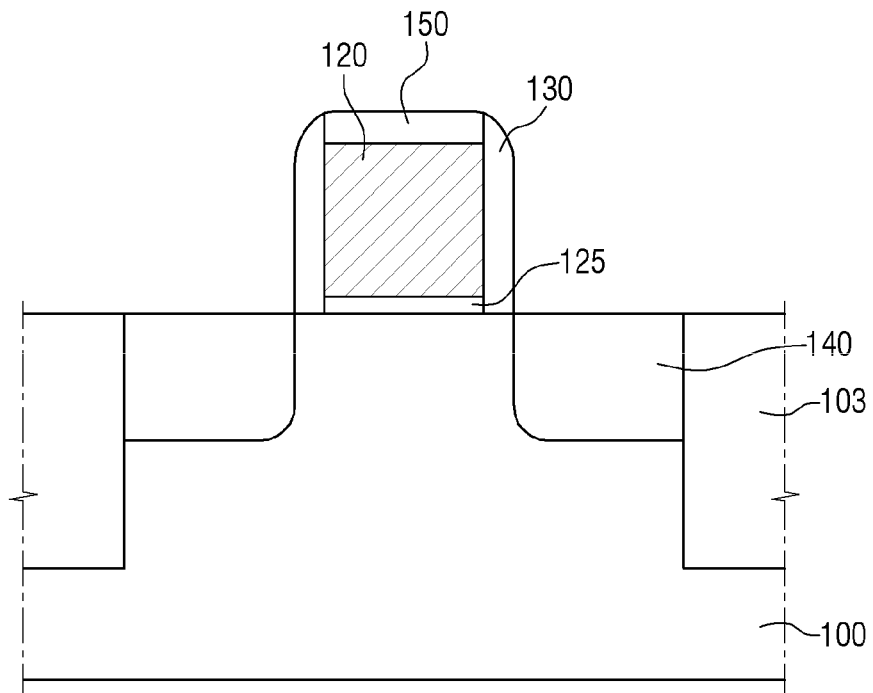

Referring to FIG. 2, a first source/drain region 140 may be formed at opposite sides of the first gate electrode 120.

The first source/drain region 140 may include an impurity.

In a case where the transistor formed on the substrate 100 is a pFET, the impurity included in the first source/drain region 140 may be a p-type impurity. The p-type impurity may be, for example, boron (B).

In a case where the transistor formed on the substrate 100 is an nFET, the impurity included in the first source/drain region 140 may be an n-type impurity. The n-type impurity may be, for example, phosphorous (P), arsenic (As), or antimony (Sb).

The first gate electrode 120 may be formed on the substrate 100, and an exposed silicon region may be provided at opposite sides of the first gate electrode 120. The exposed silicon region provided at opposite sides of the first gate electrode 120 may be included in the first source/drain region 140.

In the method of fabricating a semiconductor device according to some exemplary embodiments, the exposed silicon region provided at opposite sides of the first gate electrode 120 may be a portion of the substrate 100.

Figure 3:
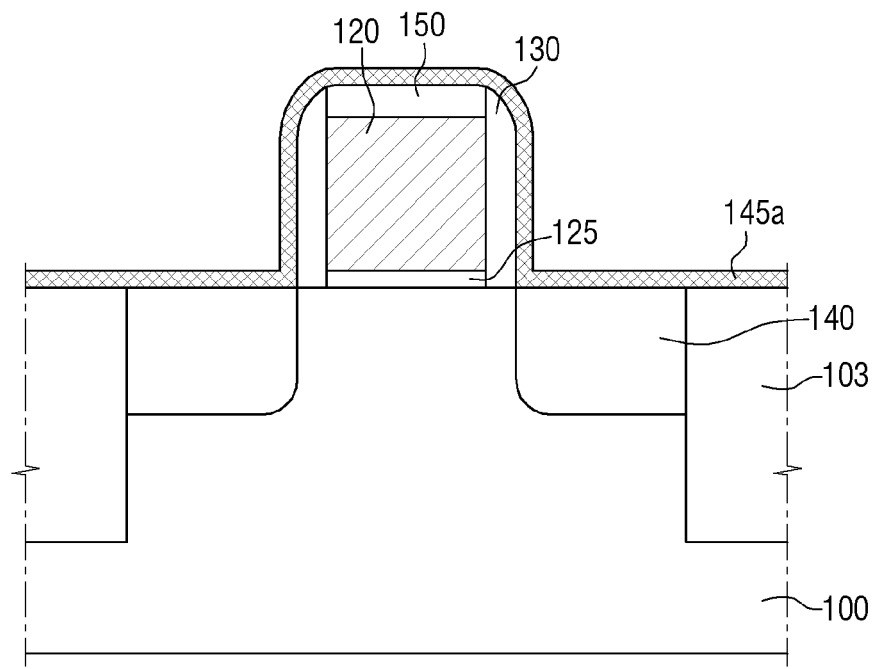

Referring to FIG. 3, a pre-metal silicide film 145a may be formed on the first source/drain region 140 where the silicon region is provided.

The pre-metal silicide film 145a may be formed on the first source/drain region 140 and the first gate electrode 120. The pre-metal silicide film 145a may contact the first source/drain region 140.

More specifically, the pre-metal silicide film 145a may be formed along a profile of the first gate stack structure 120, 125, and 150, including the first gate electrode 120, and an upper surface of the first source/drain region 140.

The pre-metal silicide film 145a may be formed using, for example, physical vapor deposition. More specifically, the pre-metal silicide film 145a may be formed using a sputtering deposition method, but not limited thereto.

The pre-metal silicide film 145a may be, for example, a rare earth metal silicide film. For example, the pre-metal silicide film 145a may include a compound ($RESi_y$) of a rare earth metal (RE) and silicon (Si). In this case, y may be a number between 1 and 2.

The pre-metal silicide film 145a may include, for example, a compound of silicon with at least one of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), ruthenium (Lu), yttrium (Y), and scandium (Sc).

When the pre-metal silicide film 145a is formed by physical vapor deposition, the pre-metal silicide film 145a may include a small amount of other metal element, in addition to the rare earth metal and silicon.

The pre-metal silicide film 145a includes rare earth metal silicide. Accordingly, the pre-metal silicide film 145a may be formed by simultaneously supplying a rare earth metal and silicon to the first source/drain region 140 in which the silicon region is disposed. For example, a rare earth metal may be supplied to the silicon region of first source/drain region 140 at the same time as the silicon is supplied in order to provide a concurrent application of constituent components comprising the pre-metal silicide film 145a.

The pre-metal silicide film 145a is directly deposited on the first source/drain region 140. Accordingly, thermal treatment is not performed for silicidation reaction of the metal and silicon. For example, the pre-metal silicide film 145a may be formed without thermal treatment for forming metal silicide.

Furthermore, after formation of the pre-metal silicide film 145a, a stripping process for removing an excess metal film left after formation of the metal silicide film is not performed.

An example of forming a pre-metal silicide film 145a including rare earth metal silicide will be described with reference to FIGS. 29 and 30.

First, FIG. 29 is a view illustrating a process of forming a rare earth metal silicide deposition target, according to certain exemplary embodiments.

First, a rare earth metal (RE) powder and a silicon (Si) powder are prepared. The prepared rare earth metal and silicon powders are mixed to perform powder synthesis (S11).

Next, sizes of the mixed powders of rare earth metal power and silicon powder are reduced by ball milling grinding (S12). In a case where the sizes of the rare earth metal and/or silicon powders are non-uniform, the subsequent compression and sintering processes may be not performed well.

In addition, the ball milling grinding enables mechanical alloying between the rare earth metal powder and the silicon powder.

Accordingly, a rare earth metal silicide (RESi$_x$) powder having a small and uniform particle size may be formed using ball mill grinding (S13). In this case, x may be a number between 1 and 2.

Next, the rare earth metal silicide powder may be reduced using hydrogen H$_2$ (S14).

Typically, a rare earth metal tends to combine with oxygen and readily oxidizes. In addition, in a case where the rare earth metal is oxidized, the oxidized rare earth metal becomes a high-k dielectric material, not a conductive material.

In the process of forming the rare earth metal silicide powder, at least a part of the rare earth metal may be oxidized upon exposure to oxygen. Thus, there is a need for reducing the quantity of rare earth metal that is oxidized.

Next, the rare earth metal silicide powder may be compression-molded using cold isostatic pressing (S15).

Because the rare earth metal is readily oxidized, the rare earth metal silicide powder may be compression-molded using cold isostatic pressing. Generally, cold isostatic pressing may include the process of transmitting pressure uniformly in all directions to a rare earth metal silicide powder that is enclosed in a flexible, sealed container and immersed in a pressure vessel filled with liquid (e.g., water).

Next, the compression-molded rare earth metal silicide powder may be sintered (S16). A rare earth metal silicide sintered body may be formed by sintering the compression-molded rare earth metal silicide powder.

The sintering of the rare earth metal silicide powder enables formation of a rare earth metal silicide sintered body with an increased density, for example, measured in g/cm$^3$.

In addition, a thermo-mechanical process may be performed on the rare earth metal silicide sintered body (S17).

The thermo-mechanical process enables growth of a microstructure of the rare earth metal silicide. For example, during the thermo-mechanical process, the rare earth metal silicide may be recrystallized or grains thereof may be grown. As a result, the density of the rare earth metal silicide sintered body may increase.

Next, the rare earth metal silicide RESi$_x$ is adhered to a deposition target mold to form a rare earth metal silicide deposition target 12 (S18).

As shown in FIG. 30, a rare earth metal silicide film may be deposited on the substrate 100 using the rare earth metal silicide-including deposition target 12 formed by the process described with reference to FIG. 29.

The rare earth metal silicide-including deposition target 12 disposed in a deposition system 10 may be sputtered.

The sputtered rare earth metal silicide RESi$_x$ faces in the direction of the substrate 100 fixed on a substrate support member 11. For example, in some embodiments, the sputtered rare earth metal (RE) and silicon (Si) simultaneously travel toward the substrate 100 and away from the rare earth metal silicide-including deposition target 12. As a result, the rare earth metal (RE) and silicon (Si) simultaneously supplied to the substrate 100 form a rare earth metal silicide film on the substrate 100.

When forming the rare earth metal silicide film on the substrate 100 by sputtering the rare earth metal silicide-including deposition target 12, the composition of rare earth metal silicide RESi$_x$ of the deposition target may be identical to or different from that of the rare earth metal silicide film formed on the substrate 100. The reason for this is that the respective materials may have different sputtering rates.

The composition of the rare earth metal silicide film formed on the substrate 100 may be controlled by controlling the composition of the rare earth metal silicide-including deposition target 12 taking into consideration the sputtering rates of the respective materials, etc.

Another example of forming the pre-metal silicide film 145a including rare earth metal silicide will be described with reference to FIG. 31.

A rare earth metal deposition target 13 including a rare earth metal (RE) and a silicon deposition target 14 including silicon (Si) are disposed in the deposition system 10.

The rare earth metal deposition target 13 and the silicon deposition target 14 may be respectively sputtered. In other words, the rare earth metal deposition target 13 and the silicon deposition target 14 may be co-sputtered.

The rare earth metal sputtered in the rare earth metal deposition target 13 and the silicon sputtered in the silicon deposition target 14 simultaneously travel toward the substrate 100, which may be fixed on a substrate support member 11.

As a result, the rare earth metal (RE) and silicon (Si) simultaneously supplied to the substrate 100 form a rare earth metal silicide film on the substrate 100.

The composition of the rare earth metal silicide film formed on the substrate 100 may be controlled by controlling amounts of the rare earth metal and silicon respectively sputtered in the rare earth metal deposition target 13 and the silicon deposition target 14. For example, the sputtering applied to the rare earth metal (RE) and the silicon (Si) may be the same or different, and the resulting composition of the rare earth metal silicide film formed on the substrate 100 may vary based on the applied sputtering and the sputtering rates of each.

Figure 4:
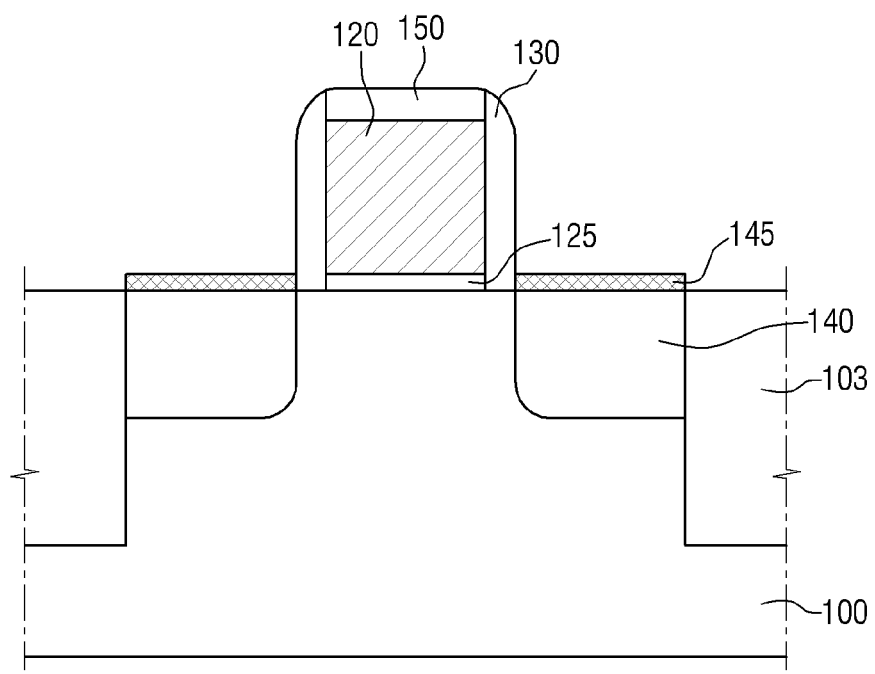

Referring to FIG. 4, the pre-metal silicide film 145a may be patterned to form a first metal silicide film 145 on the first source/drain region 140 which the exposed silicon region is. The first metal silicide film 145 may contact the first source/drain region 140.

More specifically, except for the pre-metal silicide film 145a on the first source/drain region 140, the pre-metal silicide film 145a present on the profile of the first gate stack structure 120, 125, and 150 and the device isolation film 103, as illustrated in FIG. 3, may be removed by patterning.

Like the pre-metal silicide film 145a, the first metal silicide film 145 may be a rare earth metal silicide film.

In FIGS. 3 and 4, the pre-metal silicide film 145a is formed by physical vapor deposition, and thermal treatment is not performed after formation of the pre-metal silicide film 145a. Accordingly, the composition of the pre-metal silicide film 145a may be substantially identical to that of the first metal silicide film 145. That is, the composition of the rare earth metal silicide film of the pre-metal silicide film 145a may be substantially identical to composition of the rare earth metal silicide film of the first metal silicide film 145.

An end of the first metal silicide film 145 is arranged on the boundary between the device isolation film 103 and the first source/drain region 140, as shown in FIG. 4. For example, the first metal silicide film 145 may be disposed on the entire upper surface of the first source/drain region 140, extending from the boundary between the first source/drain region 140 and device isolation film 103 to the first gate spacer 130. But this is one example provided for convenience of description, and the embodiments are not limited thereto. For example, a portion of the first metal silicide film 145 may extend along a portion of an upper surface of the first device isolation film 103. As another example, the first metal silicide film 145 may not cover the entirety of the upper surface of the first source/drain region 140.

In a case where a rare earth metal film is formed on a silicon region and a rare earth metal silicide film is then formed by the subsequent thermal treatment process, formation of the rare earth metal silicide film may be affected by diffusion coefficients between materials, thermal treatment temperature and time, energy for intermixing between elements, amount of consumed silicon atom, etc. For these reasons, when a subsequent thermal treatment process is performed, the rare earth metal silicide film may have a non-uniform composition or include a metastable phase. Alternatively, when the subsequent thermal treatment process is performed, the rare earth metal silicide film may be oxidized, have a rough interface with silicon, or be agglomerated or eroded. Due to these phenomena, performance and reliability of the semiconductor device may be degraded.

On the other hand, in embodiments where a rare earth metal silicide film is formed on the silicon region by simultaneously supplying a rare earth metal and silicon, there is no need for performing any thermal treatment to cause silicidation reaction between the metal and silicon. In addition, in such embodiments, the boundary between the silicon region and the rare earth metal silicide film may be even and it is easy to control a composition of the rare earth metal silicide film. Accordingly, reliability of the semiconductor device can be improved.

Figure 5:
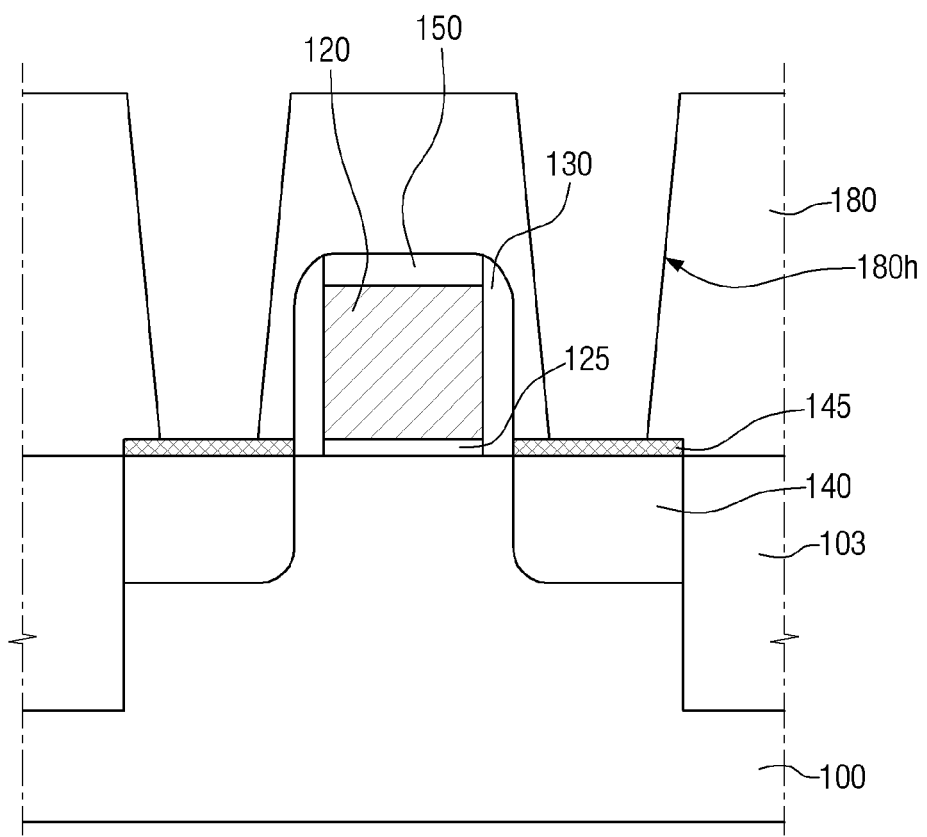

Referring to FIG. 5, an interlayer insulating film 180 may be formed on the substrate 100 such that it covers the first metal silicide film 145 and the first gate electrode 120.

The interlayer insulating film 180 may be formed on the first metal silicide film 145 and the first gate stack structure 120, 125, and 150.

The interlayer insulating film 180 may include at least one of silicon oxide, silicon nitride, silicon oxynitride, and a low-k dielectric material, for example. For example, the low-k dielectric material may include flowable oxide (FOX), Tonen silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

Next, a first contact hole 180h may be formed within the interlayer insulating film 180 such that it exposes the first metal silicide film 145. For example, a first contact hole 180h may be formed to extend from a top surface of the interlayer insulating film 180 to a top surface of the first metal silicide film 145.

Figure 6:
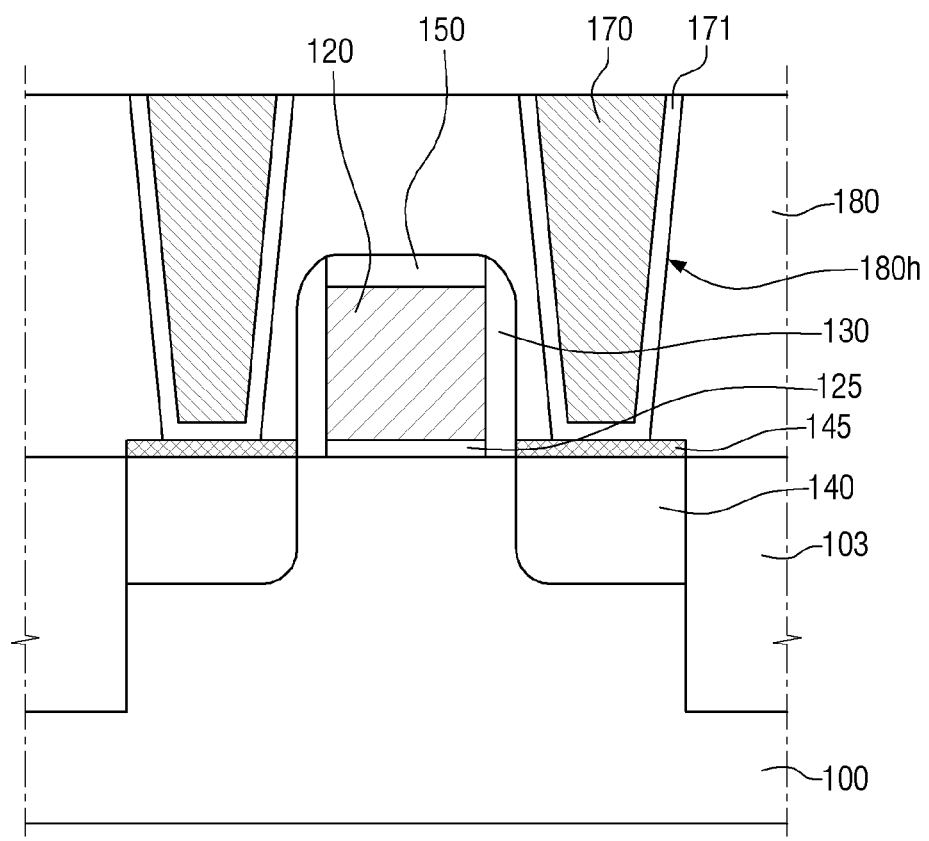

Referring to FIG. 6, a first contact 170 may be formed on the first metal silicide film 145 such that it is electrically connected to the first source/drain region 140. For example, the first contact 170 may be electrically connected (e.g., directly electrically connected) to the first source/drain region 140 through first metal silicide film 145.

The first contact 170 may be formed by filling the first contact hole 180h formed within the interlayer insulating film 180.

Further, a first barrier film 171 may be formed between the first contact 170 and the interlayer insulating film 180, and between the first contact 170 and the first metal silicide film 145. The first barrier film 171 may be formed along the sidewall of the first contact hole 180h and on the upper surface of the first metal silicide film 145.

For example, the first contact 170 may include aluminum (Al), tungsten (W), copper (Cu), cobalt (Co), doped polysilicon or the like, but the embodiments are not limited thereto.

The first barrier film 171 may for example include tantalum (Ta), tantalum nitride (TaN), titanium (Ti), titanium nitride (TiN), ruthenium (Ru), cobalt (Co), nickel (Ni), nickel boride (NiB), or tungsten nitride (WN), but the embodiments are not limited thereto.

Unlike as shown in FIG. 6, in some embodiments, the first barrier film 171 may be not formed, and the first contact 170 may contact the first metal silicide film 145.

Hereinbelow, a method of fabricating a semiconductor device according to some exemplary embodiments will be described with reference to FIGS. 1, 2 and 7 to 9.

Figure 7:
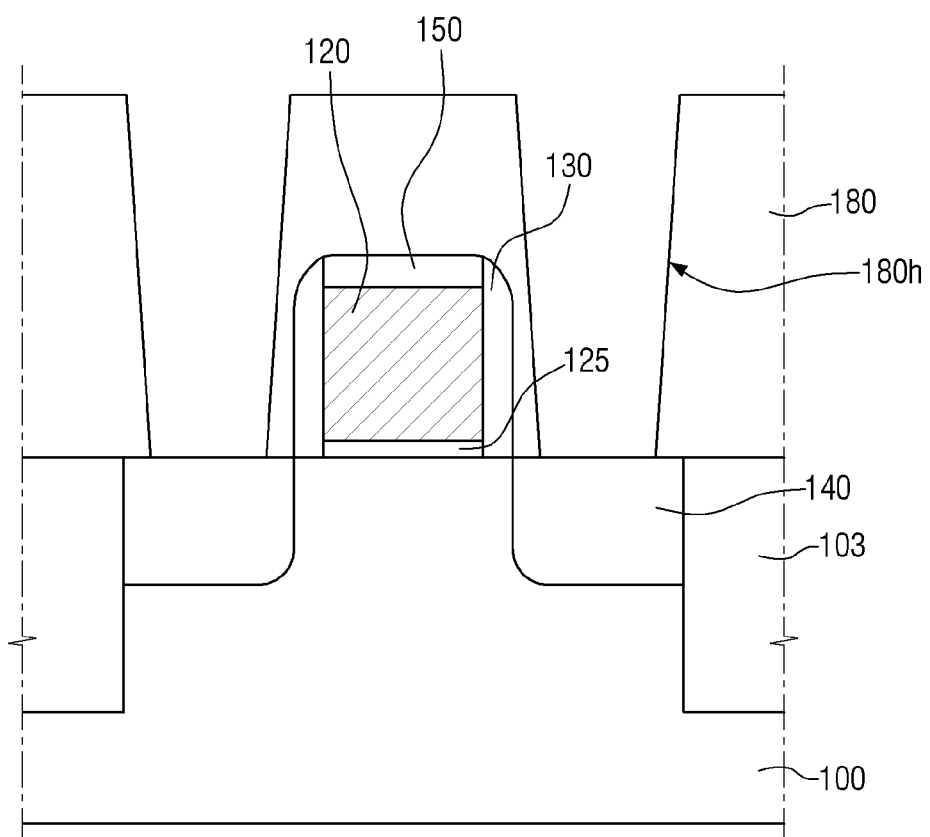
FIGS. 7 to 9 are views illustrating intermediate stages of fabrication, provided to explain a method for fabricating a semiconductor device according to some exemplary embodiments.
Figure 8:
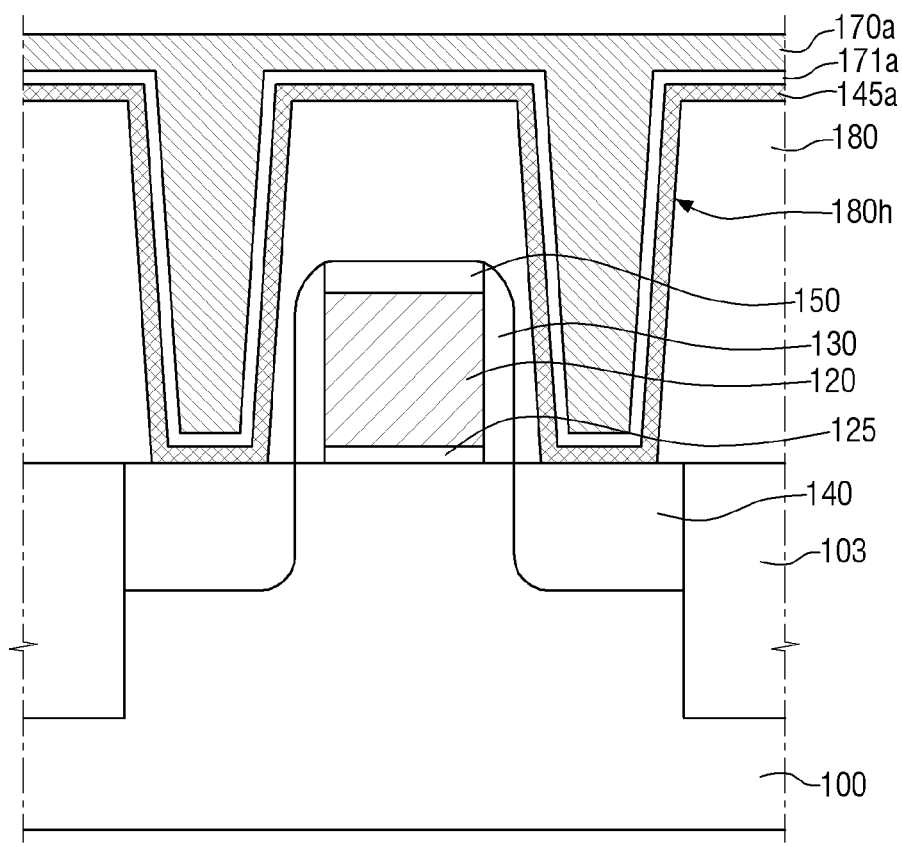
Figure 9:
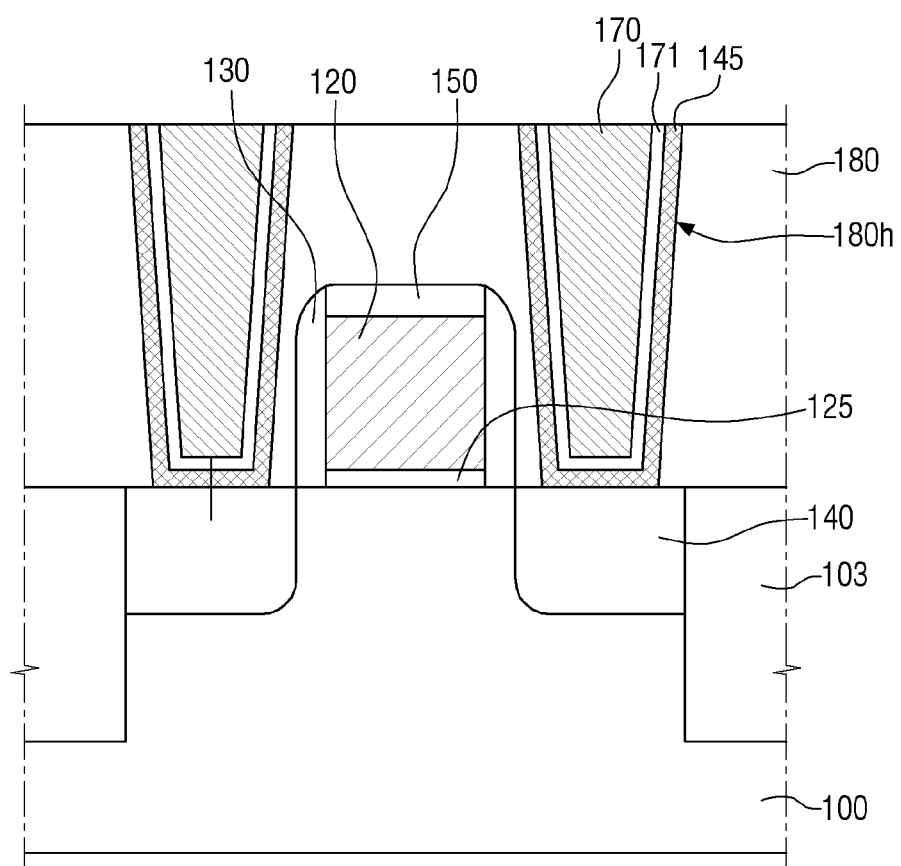

FIGS. 7 to 9 are views illustrating intermediate stages of fabrication, provided to explain a method of fabricating a semiconductor device according to some exemplary embodiments. For reference, FIG. 7 may involve a stage performed after FIG. 2.

Referring to FIG. 7, an interlayer insulating film 180 may be formed on the substrate 100 such that it covers the first source/drain region 140 and the first gate electrode 120. The interlayer insulating film 180 may be formed on the first source/drain region 140 and the first gate electrode 120.

Next, a first contact hole 180h may be formed within the interlayer insulating film 180 such that it exposes the first source/drain region 140.

Referring to FIG. 8, a pre-metal silicide film 145a may be formed on the upper surface of the first source/drain region 140, the sidewall of the first contact hole 180h and the upper surface of the interlayer insulating film 180.

The pre-metal silicide film 145a may contact the first source/drain region 140 where the exposed silicon region is located.

The pre-metal silicide film 145a may be formed using, for example, physical vapor deposition. More specifically, the pre-metal silicide film 145a may be formed using sputtering deposition, but the embodiments are not limited thereto.

A first pre-barrier film 171a may be formed on the pre-metal silicide film 145a. The first pre-barrier film 171a may be formed on the upper surface of the first source/drain region 140, the sidewall of the first contact hole 180h and the upper surface of the interlayer insulating film 180. For example, the pre-barrier film 171a may be formed on an upper surface of the pre-metal silicide film 145a as it extends across the upper surface of the first source/drain region 140, the sidewall of the first contact hole 180h and the upper surface of the interlayer insulating film 180.

Next, a first pre-contact film 170a may be formed on the first pre-barrier film 171a such that it fills the first contact hole 180h.

Referring to FIG. 9, the portions of the pre-metal silicide film 145a, the first pre-barrier film 171a and the first pre-contact film 170a on the interlayer insulating film 180 may be removed to form a first metal silicide film 145, a first barrier film 171 and a first contact 170. The metal silicide film 145, the first barrier film 171, and the first contact 170 may be formed on the upper surface of the first source/drain region 140 and the sidewall of the first contact hole 180h.

For example, the first metal silicide film 145 contacting the first source/drain region 140 may be formed by patterning a portion of the pre-metal silicide film 145a using the pre-metal silicide film 145a.

The first metal silicide film 145 may be formed not only on the upper surface of the first source/drain region 140 exposed by the first contact hole 180h, but also on the sidewall of the first contact hole 180h.

The first contact 170 may fill the first contact hole 180h having the first metal silicide film 145 formed therein.

Unlike as shown in FIGS. 8 and 9, in some embodiments, after formation of the pre-metal silicide film 145a, the first metal silicide film 145 may be formed by removing the pre-metal silicide film 145a disposed on the upper surface of the interlayer insulating film 180. After formation of the first metal silicide film 145, the first pre-barrier film 171a and the first pre-contact film 170a may be formed as well.

Figure 10:
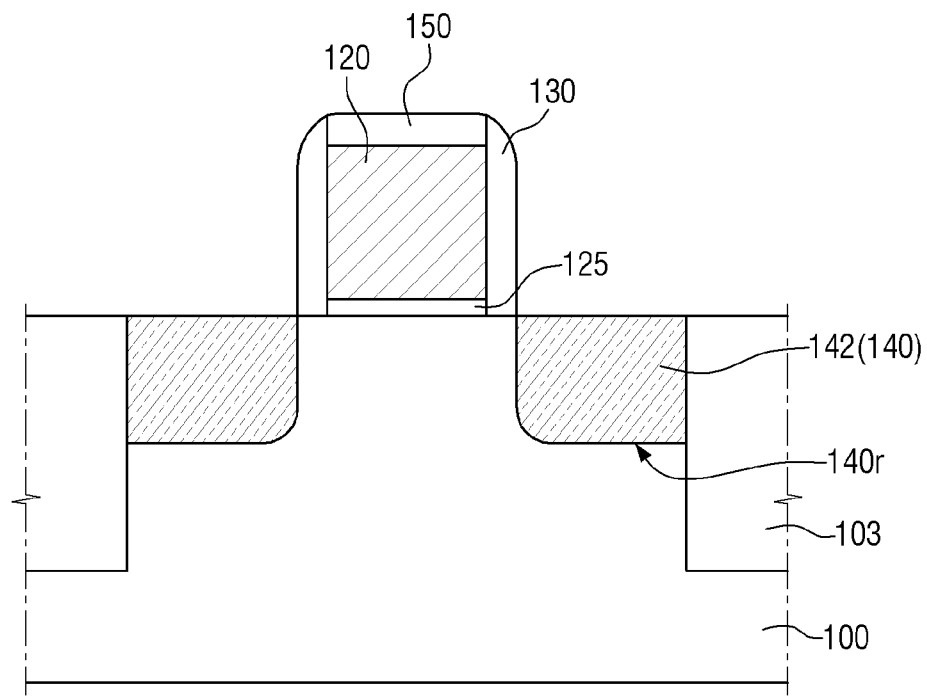
FIG. 10 is a view illustrating intermediate stages of fabrication, provided to explain a method for fabricating a semiconductor device according to some exemplary embodiments.

FIG. 10 is a view illustrating intermediate stages of fabrication, provided to explain a method of fabricating a semiconductor device according to some exemplary embodiments. For convenience of description, the following description will be made based on the differences from the description with respect to FIGS. 1 and 6.

For reference, FIG. 10 may involve an exemplary alternative stage of FIG. 2.

Referring to FIG. 10, a recess 140r may be formed within the substrate 100 at opposite sides of the first gate electrode 120.

The recess 140r has a rectangular cross-section having a round edge, as shown in FIG. 2, but such is only provided for convenience of description and the embodiments are not limited thereto. For example, the recess 140r may have any shaped cross section, including a sigma-shape (e.g., a profile similar to the Greek letter sigma, as illustrated in FIGS. 1 through 3 of U.S. Pat. No. 9,312,376, issued Apr. 12, 2016, the entire content of which is incorporated herein by reference).

Next, a first source/drain region 140 may be formed by forming a semiconductor pattern 142 filling the recess 140r using an epitaxial process. The first source/drain region 140 may include the semiconductor pattern 142. The semiconductor pattern 142 may include an impurity.

If the first source/drain region 140 includes the semiconductor pattern 142 grown by the epitaxial process, the semiconductor pattern 142 may be an exposed silicon region provided at opposite sides of the first gate electrode 120.

In a case where the transistor formed on the substrate 100 is a p-type field effect transistor (pFET), the semiconductor pattern 142 may include a compressive stress material. For example, the compressive stress material may be a material that has a higher lattice constant than Si (e.g., SiGe). For example, the compressive stress material can enhance mobility of the carrier in the channel region by applying compressive stress to the substrate 100 disposed under the first gate electrode 120.

In a case where the transistor formed on the substrate 100 is an n-type field effect transistor (nFET), the semiconductor pattern 142 may include the same material as the substrate 100 or may include a tensile stress material. For example, the semiconductor pattern 142 may be Si, or may be a material that has a lower lattice constant than Si (e.g., SiC).

As illustrated in the non-limiting example of FIG. 10, an upper surface of the semiconductor pattern 142 is flush with an upper surface of the substrate 100. For example, the upper surface of the semiconductor pattern 142 may be level with the upper surface of the substrate 100 to form a same plane between them. In some embodiments, the semiconductor pattern 142 may be formed to protrude from the upper surface of the substrate 100. For example, an upper surface of the semiconductor pattern 142 may be formed at a higher plane than that of the upper surface of the substrate 100.

Hereinbelow, a method of fabricating a semiconductor device according to some exemplary embodiments will be described with reference to FIGS. 1 to 4 and 11 to 14.

FIGS. 11 to 14 are views illustrating intermediate stages of fabrication, provided to explain a method for fabricating a semiconductor device according to some exemplary embodiments. For reference, FIG. 11 may involve a stage performed after FIG. 4.

Figure 11:
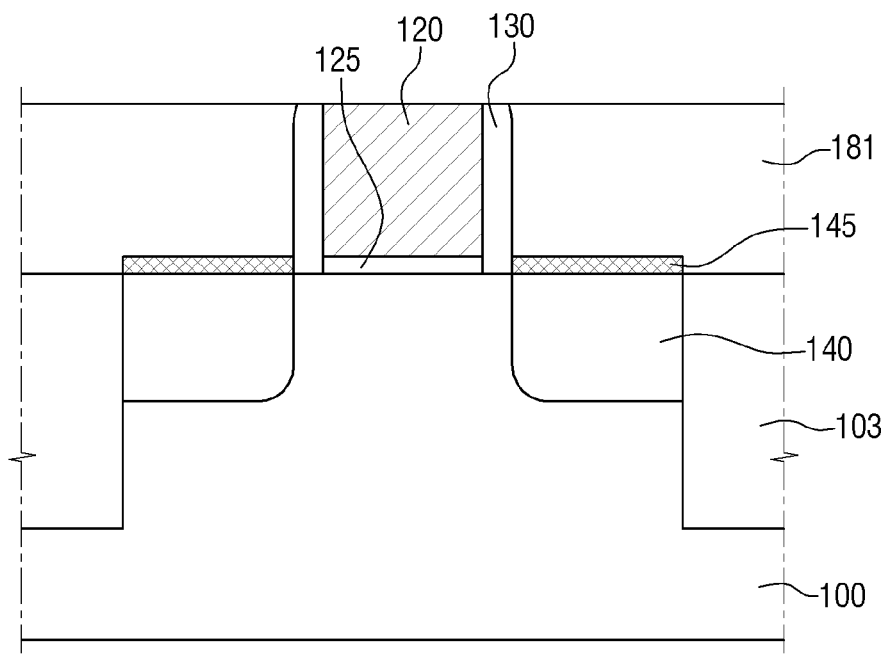
FIGS. 11 to 14 are views illustrating intermediate stages of fabrication, provided to explain a method for fabricating a semiconductor device according to some exemplary embodiments.

Referring to FIG. 11, a lower interlayer insulating film 181 may be formed on the substrate 100 such that it covers the first metal silicide film 145 and the first gate electrode 120.

The lower interlayer insulating film 181 is formed on the first metal silicide film 145 and the first gate stack structure 120, 125 and 150. Next, as illustrated in FIG. 11, a portion of the lower interlayer insulating film 181 may be removed to expose the first gate electrode 120. In some embodiments, when the portion of the lower interlayer insulating film 181 is removed to expose the first gate electrode 120, at least a portion of the first gate spacer 130 located on opposite sides of the first gate electrode 120 may also be exposed.

The lower interlayer insulating film 181 may include at least one of silicon oxide, silicon nitride, silicon oxynitride, and a low-k dielectric material, for example. For example, the low-k dielectric material may include flowable oxide (FOX), Tonen silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

Figure 12:
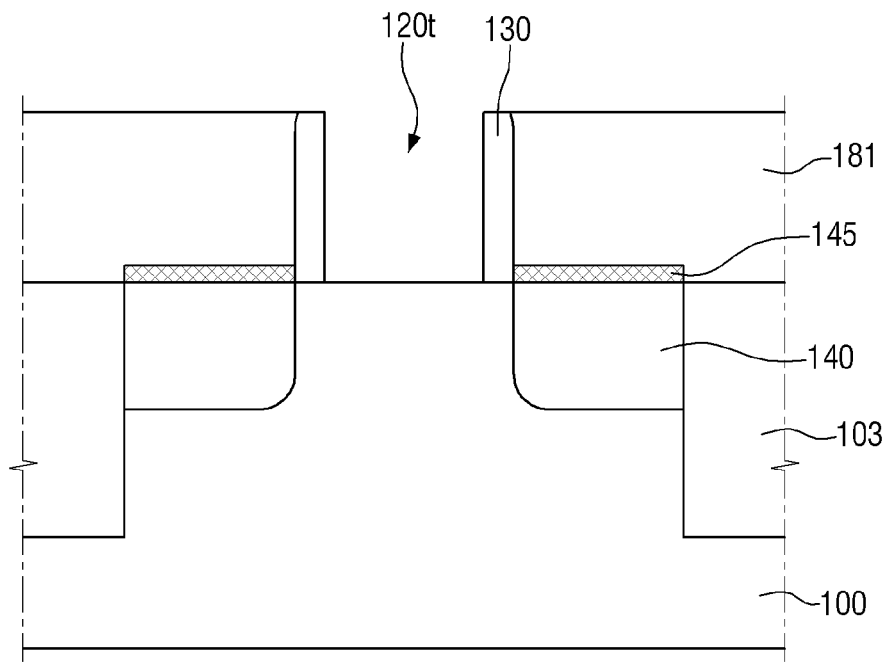

Referring to FIG. 12, the first gate electrode 120 and the first gate insulating film 125 may be removed to form a trench 120t within the lower interlayer insulating film 181.

The first gate spacer 130 may define a sidewall of the trench 120t and the substrate 100 may define a bottom surface of the trench 120t.

Figure 13:
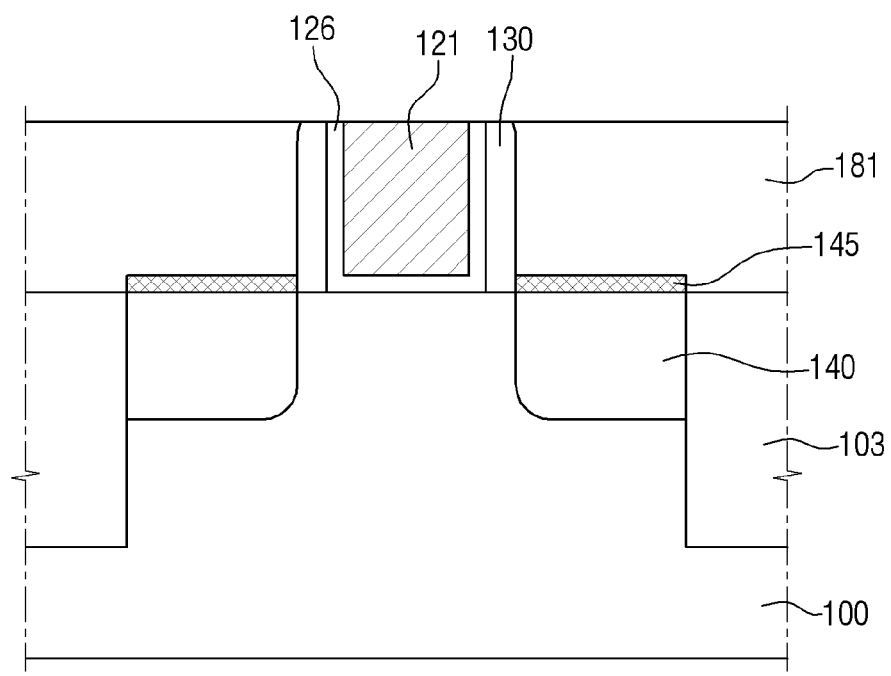

Referring to FIG. 13, a replacement gate insulating film 126 may be formed along the sidewall and the bottom surface of the trench 120t. For example, a replacement gate insulating film 126 may be formed to cover the sidewall and the bottom surface of the trench 120t.

Also, a replacement gate electrode 121 may be formed on the replacement gate insulating film 126 such that it fills the trench 120t.

Although not shown in FIG. 13, in some embodiments, an interfacial layer may be further formed between the replacement gate insulating film 126 and the substrate 100. For example, the interfacial layer may include silicon oxide.

The replacement gate insulating film 126 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Further, while the aforementioned replacement gate insulating film 126 is described mainly based on oxides, alternatively, the replacement gate insulating film 126 may include one or more of the nitride (e.g., hafnium nitride) and the oxynitride (e.g., hafnium oxynitride) of the metal materials described above, but the embodiments are not limited thereto.

The replacement gate electrode 121 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantlum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof.

Figure 14:
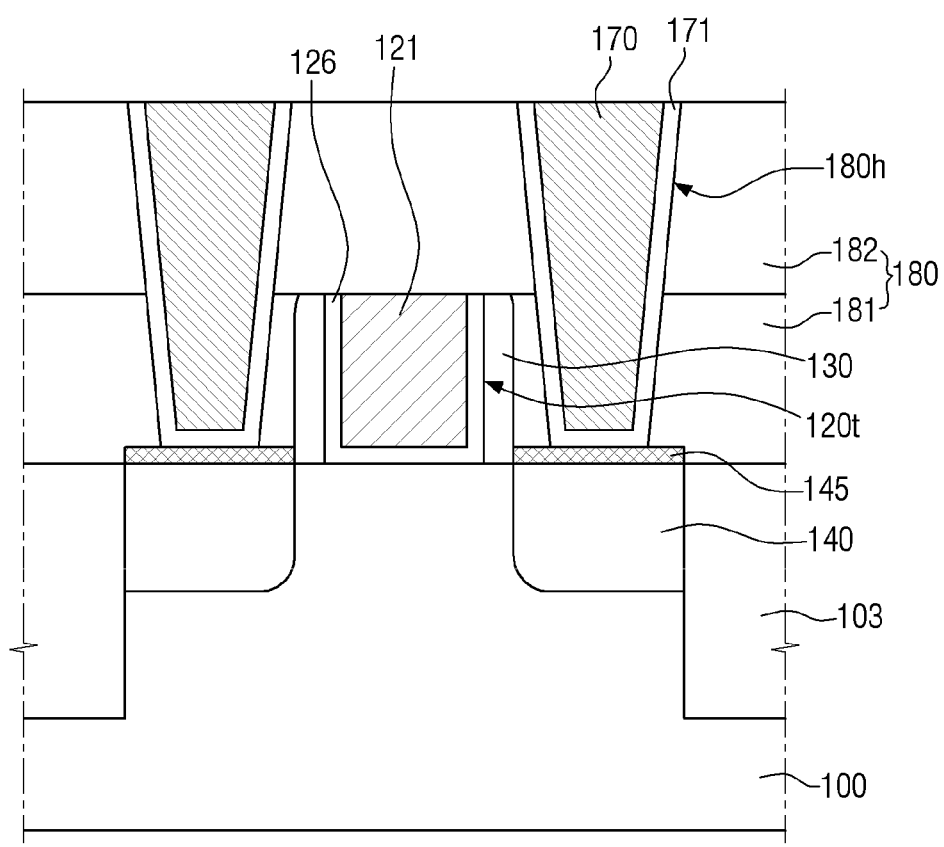

Referring to FIG. 14, an upper interlayer insulating film 182 may be formed on the lower interlayer insulating film 181, which collectively may be referred to as interlayer insulating film 180.

The upper interlayer insulating film 182 may cover an upper surface of the replacement gate electrode 121. Additionally, in some embodiments, the upper interlayer insulating film 182 may cover upper surfaces of the replacement gate insulating film 126 and the first gate spacer 130.

The upper interlayer insulating film 182 may include at least one of silicon oxide, silicon nitride, silicon oxynitride, and a low-k dielectric material, for example. For example, the low-k dielectric material may include flowable oxide (FOX), Tonen silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but the embodiments are not limited thereto.

Next, a first contact hole 180h may be formed within the interlayer insulating film 180 such that it exposes the first metal silicide film 145. The first contact hole 180h is formed to extend through both the upper interlayer insulating film 182 and the lower interlayer insulating film 181. For example, the first contact hole 180h may be formed to extend from a top surface of the upper interlayer insulating film 182 through to the lower interlayer insulating film 181, thereby exposing a top surface of the first metal silicide film 145.

A first contact 170 may be formed on the first metal silicide film 145 such that it is electrically connected to the first source/drain region 140.

In some embodiments, a first barrier film 171 may be further formed between the first contact 170 and the interlayer insulating film 180, and between the first contact 170 and the first metal silicide film 145, but the embodiments are not limited thereto.

Figure 15:
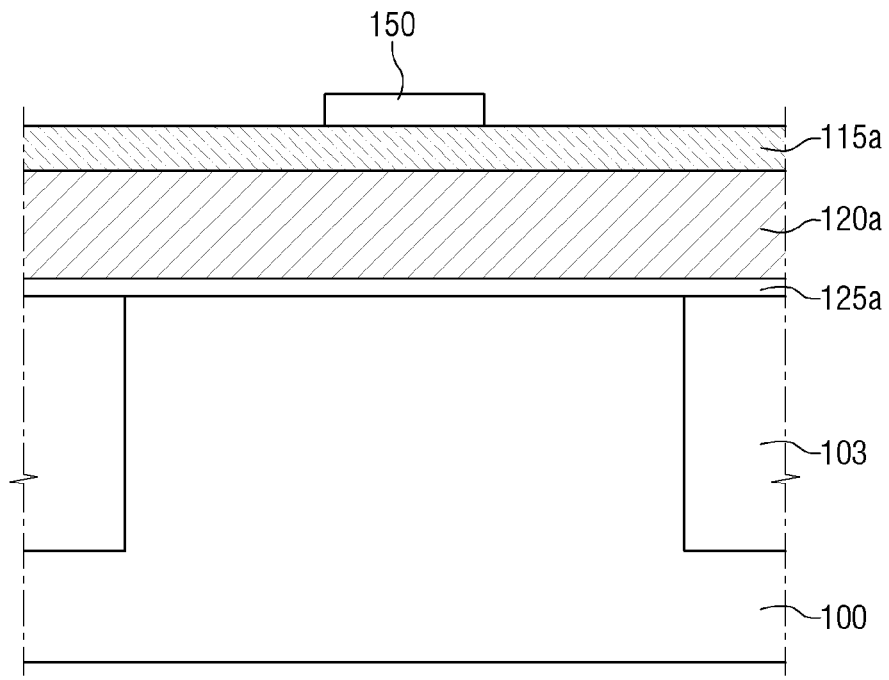
FIGS. 15 to 17 are views illustrating intermediate stages of fabrication, provided to explain a method for fabricating a semiconductor device according to some exemplary embodiments.
Figure 16:
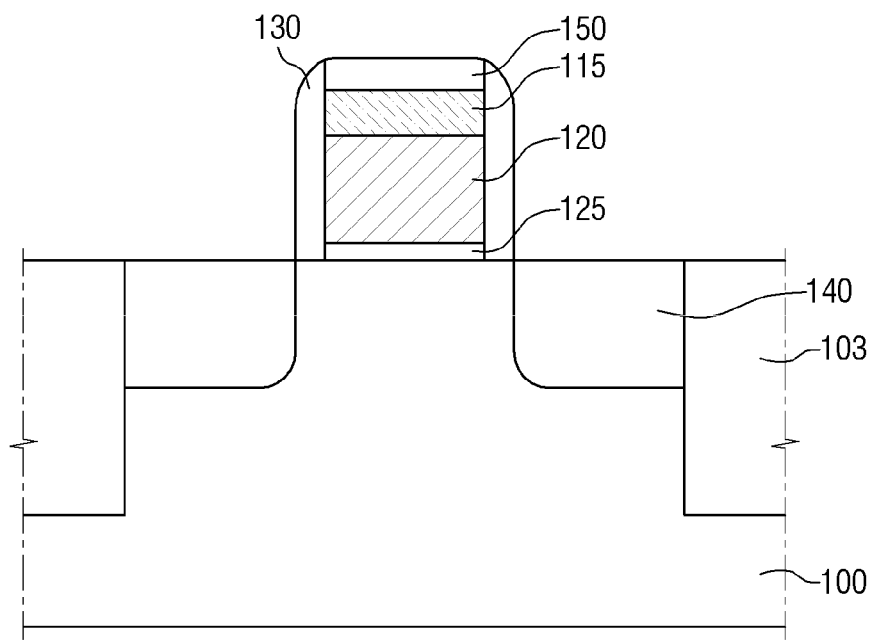
Figure 17:
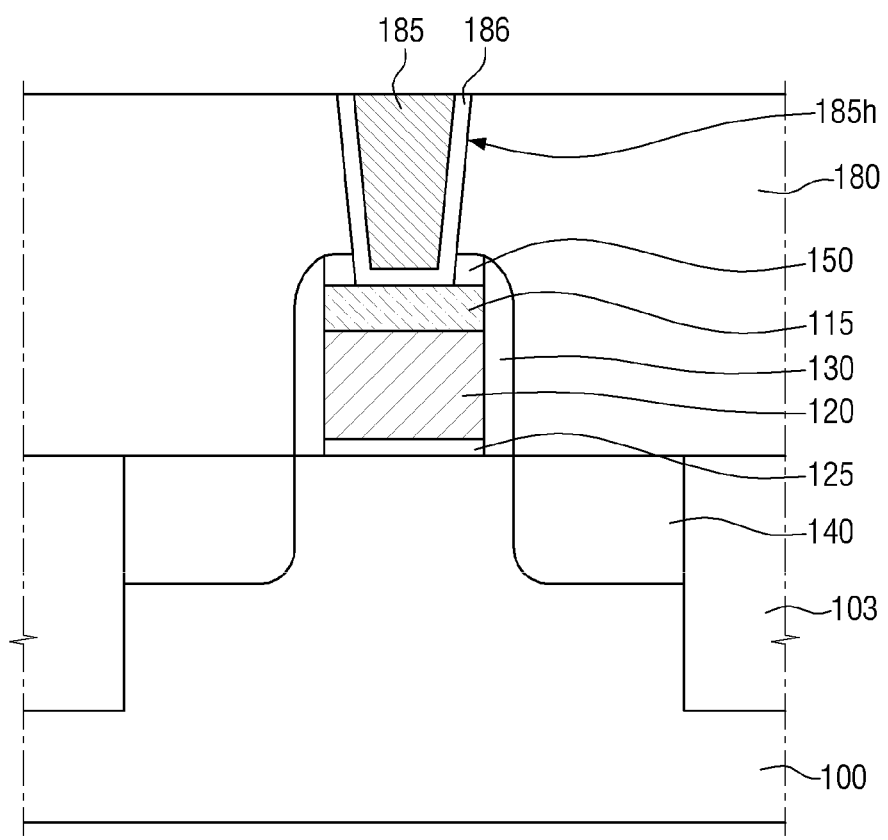

FIGS. 15 to 17 are views illustrating intermediate stages of fabrication, provided to explain a method of fabricating a semiconductor device according to some exemplary embodiments.

Referring to FIG. 15, a pre-gate insulating film 125a, a gate electrode film 120a and a pre-gate metal silicide film 115a may be sequentially formed on a substrate 100. For example, the gate electrode film 120a may be formed between the pre-gate insulating film 125a and the pre-gate metal silicide film 115a.

A first gate hard mask 150 may be formed on the pre-gate metal silicide film 115a.

The gate electrode film 120a may include silicon, for example, and more specifically, may include one of polycrystalline silicon (poly Si) and amorphous silicon (a-Si).

As illustrated, the gate electrode film 120a may be a single film, but the embodiments are not limited thereto.

In embodiments where the gate electrode film 120a is a multi-film, the gate electrode film 120a may for example include one of polycrystalline silicon (poly Si), amorphous silicon (a-Si), titanium (Ti), titanium nitride (TiN), tantalum nitride (TaN), aluminum (Al) and a combination thereof.

In such embodiments, a layer of the gate electrode film 120a that is the closest to the pre-gate metal silicide film 115a may include silicon. As a result, the gate electrode film 120a may provide an exposed silicon region. For example, the exposed silicon region may be included in the first gate electrode 120 formed using the gate electrode film 120a.

The pre-gate metal silicide film 115a may contact the gate electrode film 120a.

The pre-gate metal silicide film 115a may be formed using, for example, physical vapor deposition. More specifically, the pre-metal silicide film 145a may be formed using sputtering deposition, but the embodiments are not limited thereto.

The pre-gate metal silicide film 115a may be, for example, a rare earth metal silicide film. That is, the pre-metal silicide film 145a may include a compound ($RESi_z$) of a rare earth metal (RE) and silicon (Si). In this case, z may be a number between 1 and 2.

The pre-gate metal silicide film 115a includes a rare earth metal silicide. Accordingly, the pre-gate metal silicide film 115a may be formed by simultaneously supplying a rare earth metal and silicon to the gate electrode film 120a at the silicon region.

The pre-gate metal silicide film 115a is directly deposited on the gate electrode film 120a. Accordingly, thermal treatment is not performed for silicidation reaction of the metal and silicon.

Referring to FIG. 16, the pre-gate insulating film 125a, the gate electrode film 120a and the pre-gate metal silicide film 115a may be patterned using the first gate hard mask 150 as a mask.

As illustrated in FIG. 16, a first gate insulating film 125, a first gate electrode 120 and a gate metal silicide film 115 may be formed on the substrate 100.

Next, a first gate spacer 130 may be formed on opposite sidewalls of the first gate electrode 120. In addition, the first gate spacer 130 may be formed on opposite sidewalls of the first gate insulating film 125, the gate metal silicide film 115, and the first gate hard mask 150.

In addition, a first source/drain region 140 may be formed at opposite sides of the first gate electrode 120.

Referring to FIG. 17, an interlayer insulating film 180 may be formed on the substrate 100 such that it covers the first gate electrode 120. For example, the interlayer insulating film 180 may cover the first gate spacer 130 and first gate hard mask 150, which is formed on the gate metal silicide film 115, the first gate electrode 120, and the first gate insulating film 125.

The interlayer insulating film 180 covers the first source/drain region 140 as well. In some embodiments, the interlayer insulating film 180 may also cover the device isolation film 103.

Next, a second contact hole 185h may be formed within the interlayer insulating film 180 such that it exposes the gate metal silicide film 115.

The second contact hole 185h may be formed in the interlayer insulating film 180 and the first gate hard mask 150. For example, the second contact hole 185h may be formed to extend from a top surface of the interlayer insulating film 180 through to the first gate hard mask 150, thereby exposing a top surface of the gate metal silicide film 115.

A second contact 185 may be formed by filling the second contact hole 185h formed within the interlayer insulating film 180 and the first gate hard mask 150.

In some embodiments, a second barrier film 186 may be further formed between the second contact 185 and the interlayer insulating film 180, and between the second contact 185 and the gate metal silicide film 115. The second barrier film 186 may be formed along a sidewall of the second contact hole 185h and an upper surface of the gate metal silicide film 115.

For example, the second contact 185 may include aluminum (Al), tungsten (W), copper (Cu), cobalt (Co), doped polysilicon or the like, but not limited thereto.

The second barrier film 186 may for example include tantalum (Ta), tantalum nitride (TaN), titanium (Ti), titanium nitride (TiN), ruthenium (Ru), cobalt (Co), nickel (Ni), nickel boride (NiB), tungsten nitride (WN) or the like, but not limited thereto.

Unlike as shown in FIG. 17, in some exemplary embodiments, the second barrier film 186 may be not formed, and the second contact 185 may contact the gate metal silicide film 115.

Hereinbelow, a method of fabricating a semiconductor device according to some exemplary embodiments will be described with reference to FIGS. 1, 2, 18 and 19.

Figure 18:
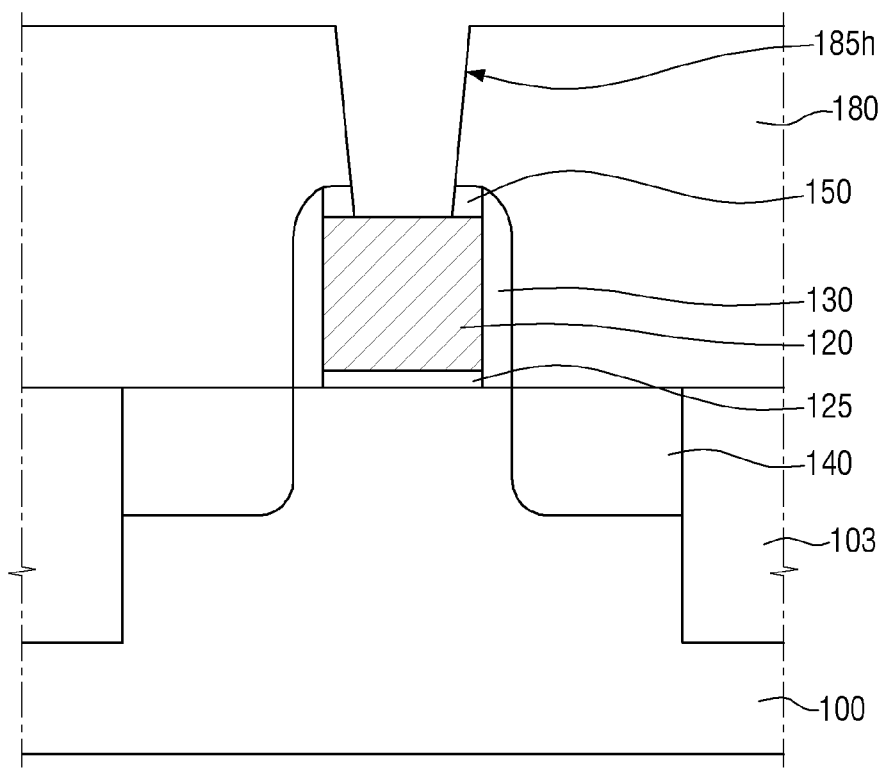
FIGS. 18 to 19 are views illustrating intermediate stages of fabrication, provided to explain a method for fabricating a semiconductor device according to some exemplary embodiments.
Figure 19:
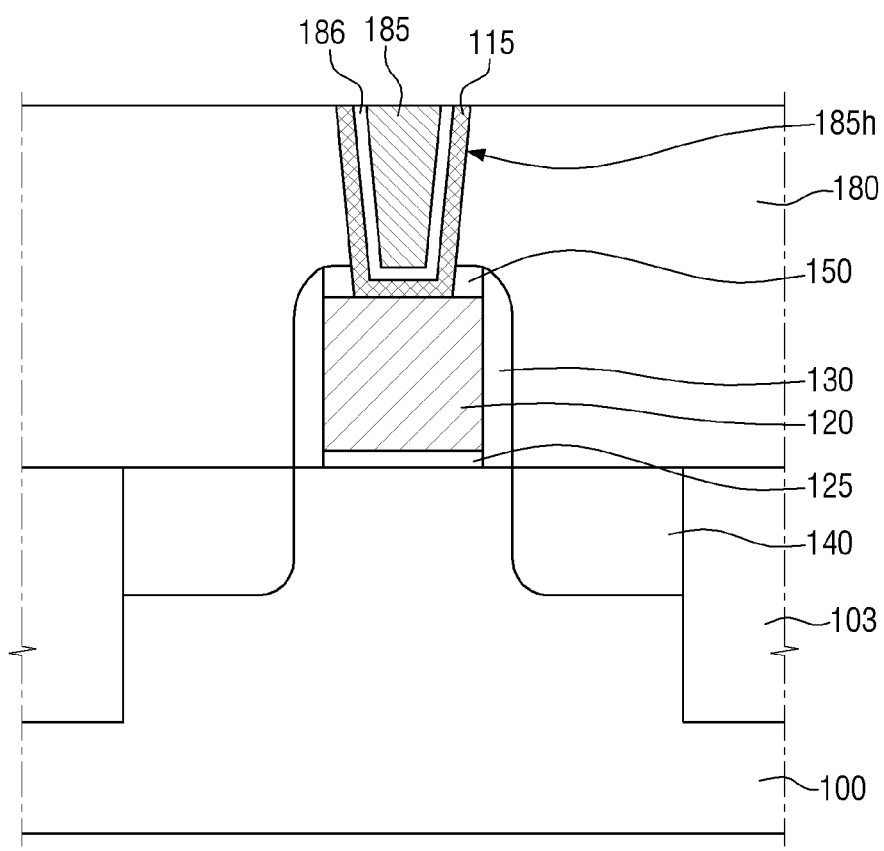

FIGS. 18 to 19 are views illustrating intermediate stages of fabrication, provided to explain a method for fabricating a semiconductor device according to some exemplary embodiments. For reference, FIG. 18 may involve a stage performed after FIG. 2.

Referring to FIG. 18, an interlayer insulating film 180 may be formed on the substrate 100 such that it covers the first source/drain region 140 and the first gate electrode 120.

The interlayer insulating film 180 may be formed on the first source/drain region 140 and the first gate electrode 120. For example, the interlayer insulating film 180 may cover the first gate spacer 130 and first gate hard mask 150, which is formed on the first gate electrode 120 and the first gate insulating film 125. In some embodiments, the interlayer insulating film 180 also may cover the first source/drain region 140 and the device isolation film 103.

Next, a second contact hole 185h may be formed within the interlayer insulating film 180 such that it exposes the first gate electrode 120. In some embodiments, the second contact hole 185h may be formed in the interlayer insulating film 180 and the first gate hard mask 150, extending from a top surface of the interlayer insulating film 180 through to the first gate hard mask 150, thereby exposing a top surface of the first gate electrode 120.

Referring to FIG. 19, a gate metal silicide film 115 may be formed on the upper surface of the first gate electrode 120 and on the sidewall of the second contact hole 185h.

A second barrier film 186 and a second contact 185 may be formed within the second contact hole 185h having the gate metal silicide film 115 formed therein. For example, a second barrier film 186 may be formed to cover the sidewall and the bottom surface of the gate metal silicide film 115, and the second contact may be formed on the second barrier film 186 such that it fills the second contact hole 185h.

Figure 22:
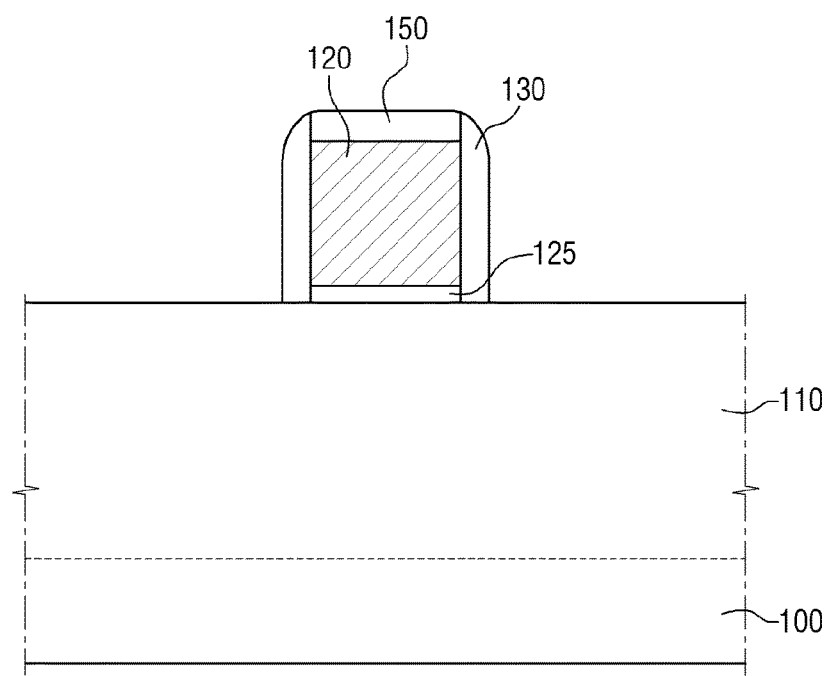

FIGS. 20 to 22 are views provided to explain a method of fabricating a semiconductor device according to some exemplary embodiments.

FIGS. 21A and 21B are cross sectional views taken along lines A-A and B-B of FIG. 20, respectively.

The drawings regarding a method of fabricating a semiconductor device according to some exemplary embodiments exemplify a fin-type field effect transistor (FinFET) including a channel region having a fin-type pattern shape, but they are not limited thereto. For example, a semiconductor device fabricated by the method of fabricating a semiconductor device according to some exemplary embodiments may include a tunneling transistor (tunneling FET), a transistor comprising a nanowire, a transistor comprising a nano-sheet, or a three-dimensional (3D) transistor.

Referring to FIGS. 20 to 21B, a fin-type pattern 110 may be formed on the substrate 100. The fin-type pattern 110 may extend longitudinally in one direction (e.g., X-direction). For example, the fin-type pattern 110 may have a length, as measured in the X-direction, that is larger than its width, as measured in the Y-direction.

A field insulating film 105 may be formed on the substrate 100. The field insulating film 105 may surround a portion of the fin-type pattern 110. For example, the fin-type pattern 110 may include a portion that protrudes above the upper surface of the field insulating film 105 (e.g., in the Z-direction).

In some embodiments, the fin-type pattern 110 may be a portion of the substrate 100, and may include an epitaxial layer grown from the substrate 100.

The fin-type pattern 110 may include an element semiconductor material such as silicon or germanium, for example. Further, the fin-type pattern 110 may include a compound semiconductor such as, for example, IV-IV group compound semiconductor or III-V group compound semiconductor.

Specifically, in embodiments having the IV-IV group compound semiconductor, for example, the fin-type pattern 110 may be a binary or ternary compound including at least two of carbon (C), silicon (Si), germanium (Ge), and tin (Sn), or the above-mentioned binary or ternary compound doped with a IV group element.

In embodiments having the III-V group compound semiconductor, for example, the fin-type pattern 110 may be a binary, ternary or quaternary compound which is formed by combination of at least one III group element selected from aluminum (Al), gallium (Ga), and indium (In), with one V group element selected from phosphorus (P), arsenic (As) and antimony (Sb).

In describing a method of fabricating a semiconductor device according to some exemplary embodiments, the exemplary fin-type pattern 110 includes a fin-type pattern including silicon.

The following description corresponds to the cross sectional view taken along the line A-A of FIG. 21A.

Referring to FIG. 22, a first gate insulating film 125, a first gate electrode 120, and a first gate hard mask 150 may be sequentially formed on the fin-type pattern 110 such that they cross the fin-type pattern 110. For example, the first gate insulating film 125 may be formed on the fin-type pattern 110, and the first gate electrode 120 may be formed between the first gate insulating film 125 and the first gate hard mask 150.

Next, a first gate spacer 130 may be formed on opposite sidewalls of the first gate electrode 120 such that it crosses the fin-type pattern 110. In addition, the first gate spacer 130 may be formed on opposite sidewalls of the first gate insulating film 125 and the first gate hard mask 150.

Next, a first metal silicide film 145 or a gate metal silicide film 115 may be formed using the method of fabricating a semiconductor device according to some exemplary embodiments described with reference to FIGS. 2 to 14, 18 and 19.

Furthermore, unlike as shown in FIG. 22, in some embodiments, the gate metal silicide film 115 crossing the fin-type pattern 110 may be formed using the method shown in FIGS. 15 and 16.

FIGS. 23 to 28 are views illustrating intermediate stages of fabrication, provided to explain a method for fabricating a semiconductor device according to some exemplary embodiments.

Figure 23:
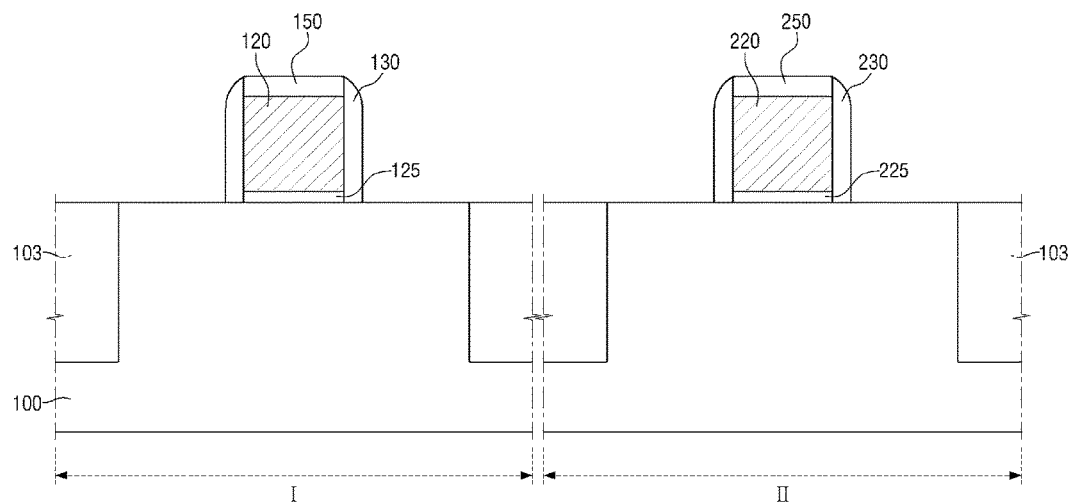
FIGS. 23 to 28 are views illustrating intermediate stages of fabrication, provided to explain a method for fabricating a semiconductor device according to some exemplary embodiments.

Referring to FIG. 23, a first gate insulating film 125, a first gate electrode 120, a first gate hard mask 150 and a first gate spacer 130 may be formed on a substrate 100 of a first region I such that they are sequentially stacked thereon. For example, the first gate insulating film 125 may be formed on the substrate 100 of the first region I, the first gate electrode 120 may be formed between the first gate insulating film 125 and the first gate hard mask 150, and the first gate spacer 130 may be formed on opposite sidewalls of the first gate insulating film 125, the first gate electrode 120, and the first gate hard mask 150. Also, a second gate insulating film 225, a second gate electrode 220, a second gate hard mask 250 and a second gate spacer 240 may be formed on the substrate 100 of a second region II such that they are sequentially stacked thereon. For example, the second gate insulating film 225 may be formed on the substrate 100 of the second region II, the second gate electrode 220 may be formed between the second gate insulating film 225 and the second gate hard mask 250, and the second gate spacer 230 may be formed on opposite sidewalls of the second gate insulating film 225, the second gate electrode 220, and the second gate hard mask 250.

The substrate 100 may include the first region I and the second region II. The first region I and the second region II may be spaced apart from or adjacent to each other. In the method for fabricating a semiconductor device according to some exemplary embodiments, an nMOS may be formed in the first region I and a pMOS may be formed in the second region II.

Description associated with the second gate insulating film 225, the second gate electrode 220 and the second gate hard mask 250 is substantially similar to description associated with the respective first gate insulating film 125, the first gate electrode 120 and the first gate hard mask 150, and is thus omitted.

Figure 24:
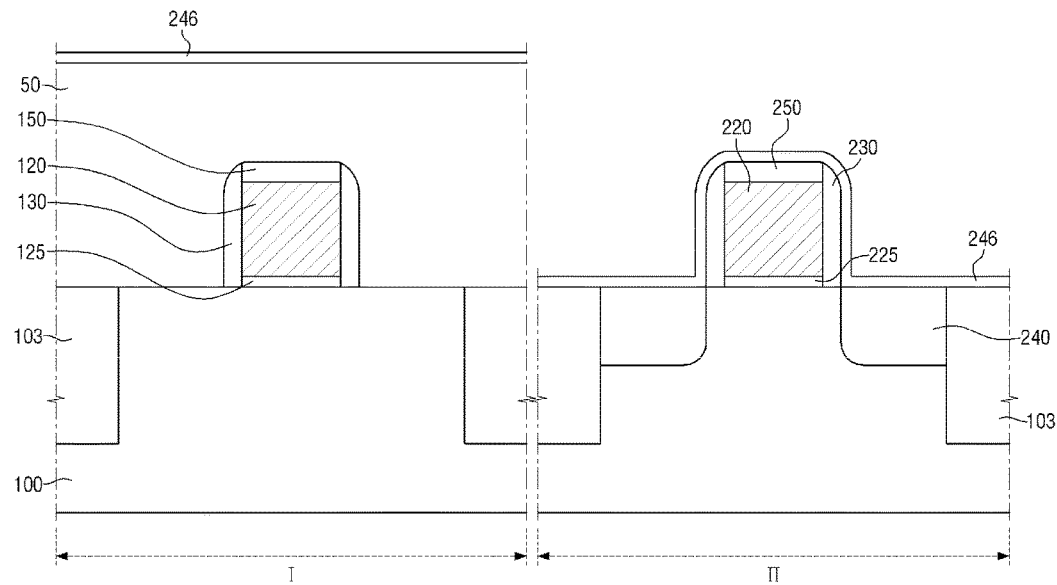

Referring to FIG. 24, a first mask pattern 50 may be formed on the substrate 100 of the first region I such that it covers the first gate electrode 120. For example, the first mask pattern 50 may cover the first gate spacer 130 and the first gate hard mask 150, which is formed on the first gate electrode 120 and the first gate insulating film 125. The first mask pattern 50 is not formed in the second region II.

A second source/drain region 240 may be formed at opposite sides of the second gate electrode 220. The second source/drain region 240 may include a p-type impurity.

Next, a pre-metal film 246 may be formed along an upper surface of the second source/drain region 240 and a profile of the second gate stack structure 220, 225 and 250 and the second gate spacer 230. The pre-metal film 246 may be formed on the first mask pattern 50 formed on the first region I as well.

The pre-metal film 246 may be formed using for example physical vapor deposition or chemical vapor deposition.

In some embodiments, the pre-metal film 246 may not include a rare earth metal. For example, the pre-metal film 246 may include at least one of titanium (Ti), nickel (Ni), cobalt (Co), tungsten (W), platinum (Pt) and palladium (Pd), but the embodiments are not limited thereto.

Unlike as shown in the drawings, in some embodiments, the first mask pattern 50 may be formed along the upper surface of the substrate 100 of the first region I and the profile of the first gate stack structure 120, 125 and 150 and first gate spacer 130 as well.

In addition, as illustrated in FIG. 24, a first source/drain region 140 is not formed at opposite sides of the first gate electrode 120, but the embodiments are not limited thereto. In some embodiments, the first source/drain region 140 may be formed before formation of the first mask pattern 50.

Figure 25:
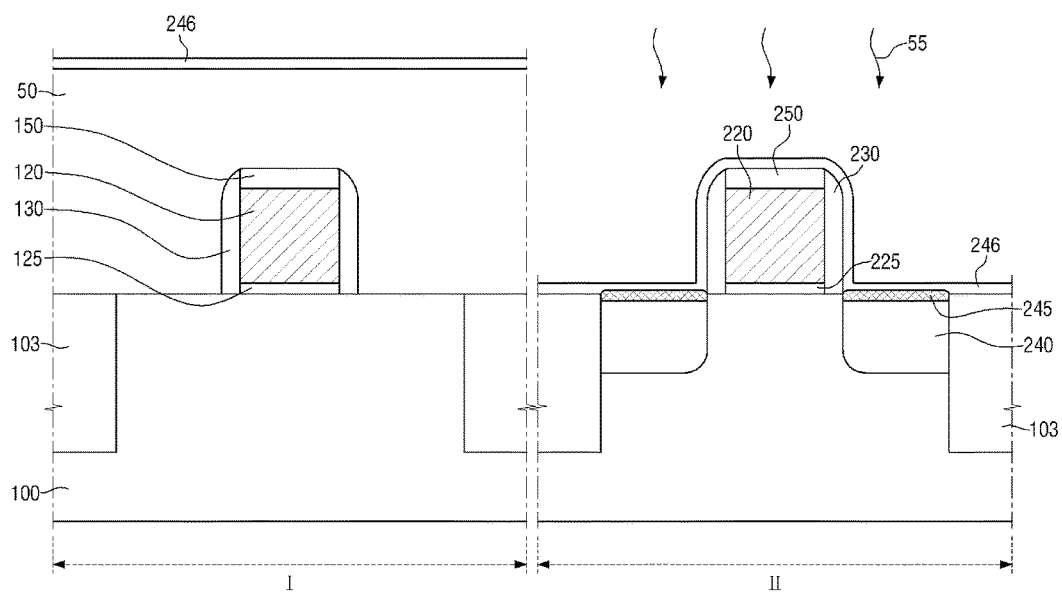

Referring to FIG. 25, a second metal silicide film 245 may be formed on the second source/drain region 240 by thermal treatment 55.

The second metal silicide film 245 may be formed by silicidation reaction between the pre-metal film 246 and silicon included in the second source/drain region 240. The second metal silicide film 245 is in contact with the second source/drain region 240.

The second metal silicide film 245 may be formed by consuming silicon included in the second source/drain region 240. For example, the second metal silicide film 245 may be formed at an interface of the second source/drain region 240 and the pre-metal film 246, and extend above and below the boundary the second source/drain region 240 and the pre-metal film 246, as the boundary existed prior to the thermal treatment 55.

Figure 26:
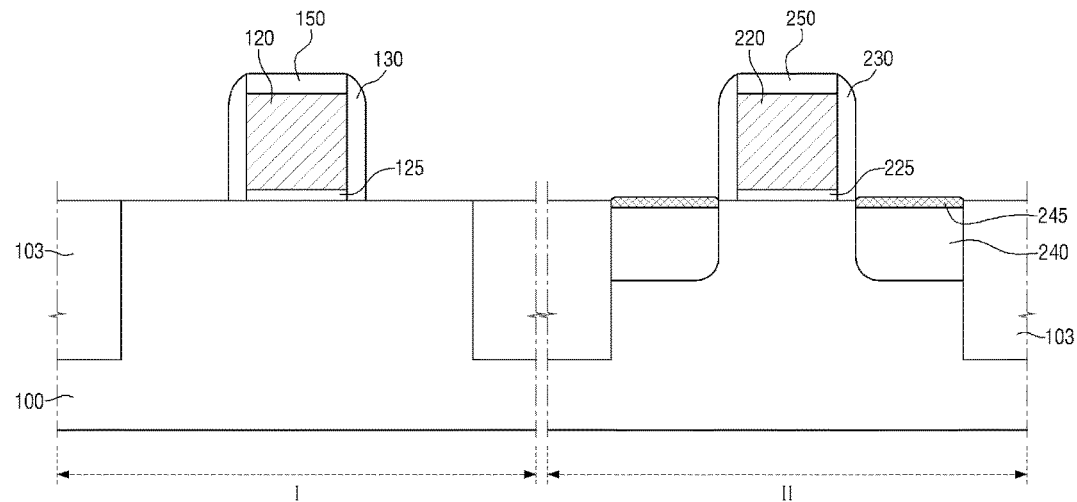

Referring to FIG. 26, the pre-metal film 246 left on the second region II after formation of the second metal silicide film 245 may be stripped, leaving the portion of the second metal silicide film 245 that was formed at the interface of the second source/drain region 240 and the pre-metal film 246. At this time, the pre-metal film 246 present on the first mask pattern 50 of the first region I may be removed as well.

Next, the first mask pattern 50 formed in the first region I may be removed.

Figure 27:
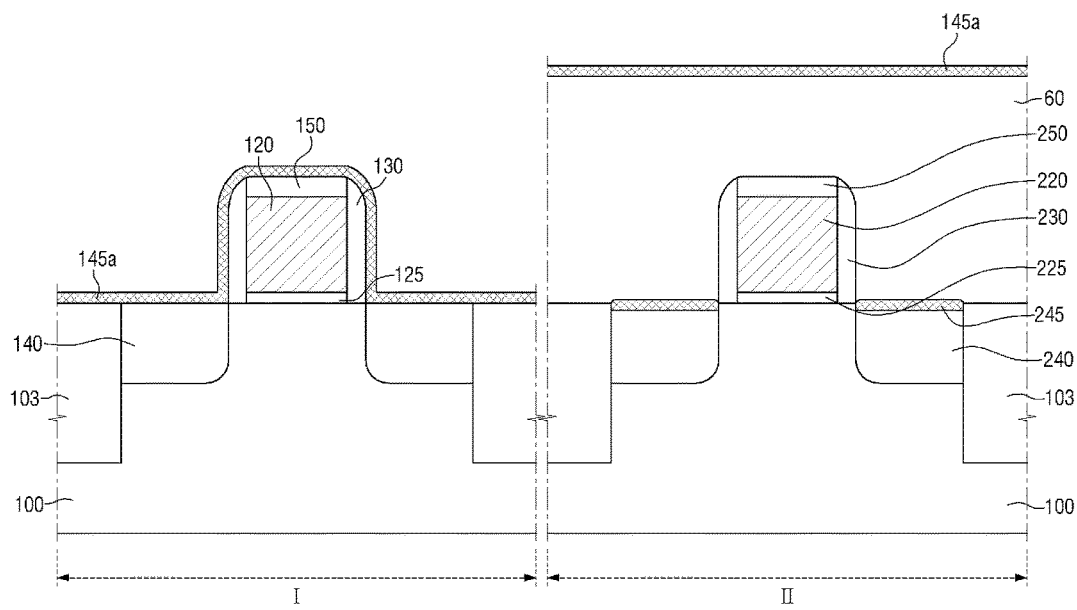

Referring to FIG. 27, a first source/drain region 140 may be formed at opposite sides of the first gate electrode 120. The first source/drain region 140 may include an n-type impurity.

Next, a second mask pattern 60 may be formed on the substrate 100 of the second region II such that it covers the second gate electrode 220 and the second metal silicide film 245. For example, the second mask pattern 60 may cover the second gate spacer 230, the second gate hard mask 250, which is formed on the second gate electrode 220 and the second gate insulating film 225, and the second metal silicide film 245, which is formed over the second source/drain region 240. The second mask pattern 60 is not formed in the first region I.

Next, a pre-metal silicide film 145*a* may be formed on the first source/drain region 140 and the first gate electrode 120. The pre-metal silicide film 145*a* may be formed along the profile of the first gate stack structure 120, 125, and 150, including the first gate electrode 120 and the first gate spacer 130, as well as an upper surface of the first source/drain region 140.

The pre-metal silicide film 145*a* may be formed on the second mask pattern 60 formed in the second region II as well.

The pre-metal silicide film 145a may be formed using, for example, physical vapor deposition. More specifically, the pre-metal silicide film 145a may be formed using sputtering deposition, but the embodiments are not limited thereto.

The pre-metal silicide film 145a may be for example a rare earth metal silicide film.

Unlike as shown in the drawing, in some embodiments, the second mask pattern 60 may be formed along the upper surface of the substrate 100 and the profile of the second gate stack structure 220, 225 and 250.

Figure 28:
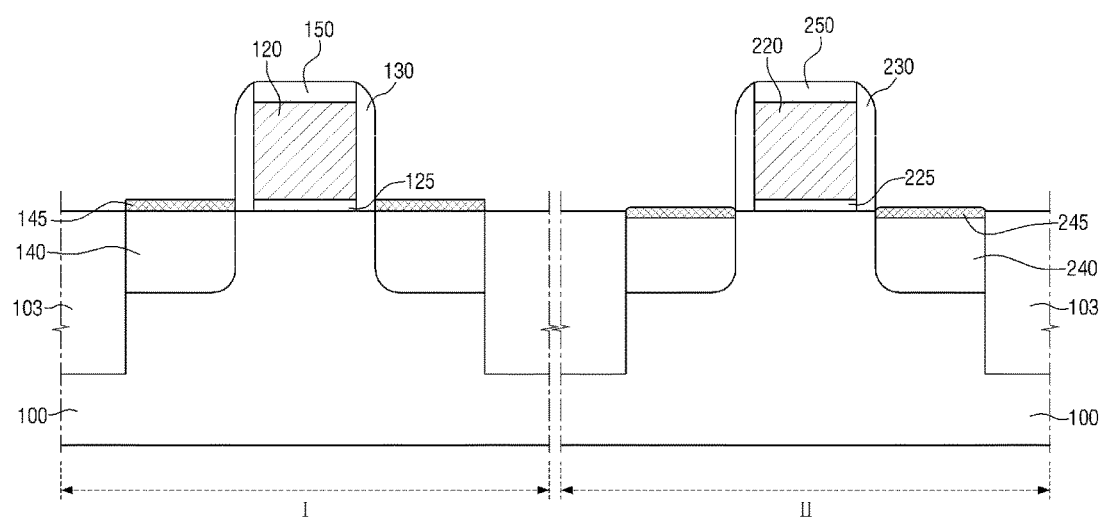

Referring to FIG. 28, the pre-metal silicide film 145a may be patterned to form a first metal silicide film 145 on the first source/drain region 140.

More specifically, except for the pre-metal silicide film 145a on the first source/drain region 140, the pre-metal silicide film 145a present on the profile of the first gate stack structure 120, 125 and 150, portions of the first gate spacer 130, and the device isolation film 103 may be removed by patterning. At this time, the pre-metal silicide film 145a on the second mask pattern 60 may be removed as well.

Next, the second mask pattern 60 formed on the second region II may be removed.

The first metal silicide film 145 may be a rare earth metal silicide film while the second metal silicide film 245 may be not a rare earth metal silicide film. That is, the first metal silicide film 145 and the second metal silicide film 245 may include different materials.

The rare earth metal silicide film is not formed in the region where a pMOS is formed, as shown in FIGS. 23 to 28, but the embodiments are not limited thereto.

Unlike as described with reference to FIGS. 23 to 28, in some embodiments, each of the first metal silicide film 145 and the second metal silicide film 245 may be a rare earth metal silicide film. When the second metal silicide film 245 is a rare earth metal silicide film, the second metal silicide film 245 may be directly formed on the second source/drain region 240 using physical vapor deposition.

Figure 32:
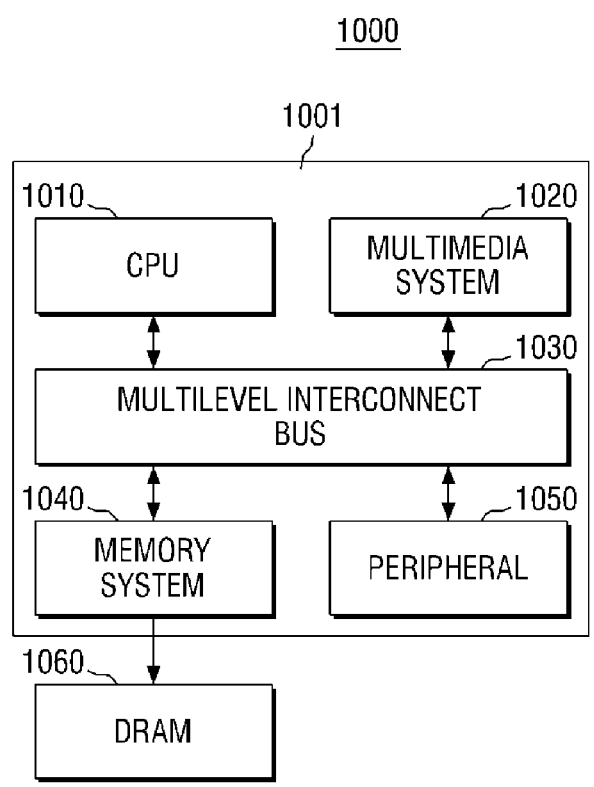
FIG. 32 is a block diagram of an SoC system comprising a semiconductor device fabricated using the method of fabricating a semiconductor device according to some exemplary embodiments.

FIG. 32 is a block diagram of an SoC system comprising a semiconductor device fabricated using the method of fabricating a semiconductor device according to some exemplary embodiments.

Referring to FIG. 32, the SoC system 1000 includes an application processor 1001 and a dynamic random-access memory (DRAM) 1060.

The application processor 1001 may include a central processing unit (CPU) 1010, a multimedia system 1020, a multilevel interconnect bus (hereinafter, referred to as "bus") 1030, a memory system 1040 and a peripheral circuit ("peripheral") 1050.

The CPU 1010 may perform arithmetic operations necessary for driving of the SoC system 1000. In some exemplary embodiments, the CPU 1010 may be configured on a multi-core environment which includes a plurality of cores.

The multimedia system 1020 may be used for performing a variety of multimedia functions on the SoC system 1000. The multimedia system 1020 may include a 3D engine module, a video codec, a display system, a camera system, a post-processor, or the like.

The bus 1030 may be used for exchanging data communications between and/or among the CPU 1010, the multimedia system 1020, the memory system 1040 and the peripheral circuit 1050. In some exemplary embodiments, the bus 1030 may have a multi-layer structure. Specifically, an example of the bus 1030 may be a multi-layer advanced high-performance bus (AHB), or a multi-layer advanced eXtensible interface (AXI), although exemplary embodiments are not limited thereto.

The memory system 1040 may provide environments necessary for the application processor 1001 to connect to an external memory (e.g., DRAM 1060) and perform high-speed operation. In some exemplary embodiments, although not shown, the memory system 1040 may include a separate controller (e.g., DRAM controller) to control an external memory (e.g., DRAM 1060).

The peripheral circuit 1050 may provide environments necessary for the SoC system 1000 to have a seamless connection to an external device (e.g., main processing circuit or board). Accordingly, the peripheral circuit 1050 may include a variety of interfaces to allow compatible operation with the external device connected to the SoC system 1000.

The DRAM 1060 may function as an operation memory necessary for the operation of the application processor 1001. In some exemplary embodiments, the DRAM 1060 may be arranged externally to the application processor 1001, as illustrated. For example, the DRAM 1060 may be packaged into a package on package (PoP) type with the application processor 1001.

At least one of the above-mentioned components of the SoC system 1000 may include at least one of the semiconductor devices according to the exemplary embodiments explained above.

In concluding the detailed description, those skilled in the art will appreciate that many variations and modifications can be made to the disclosed embodiments without substantially departing from the principles of the present concepts. Therefore, the disclosed embodiments are used in a generic and descriptive sense only and not for purposes of limitation.

What is claimed is:

1. A method of fabricating a semiconductor device comprising:
   providing an exposed silicon region;
   forming a rare earth metal silicide film on the exposed silicon region by simultaneously supplying a rare earth metal and a silicon to the exposed silicon region using physical vapor deposition, the rare earth metal silicide film contacting the exposed silicon region; and
   forming a contact on the rare earth metal silicide film, the contact being electrically connected to the exposed silicon region.

2. The method of claim 1, wherein the rare earth metal silicide film is formed without thermal treatment.

3. The method of claim 1, wherein the rare earth metal silicide film is formed using one of a first deposition target including rare earth metal silicide or second deposition targets including the rare earth metal and the silicon.

4. The method of claim 1, wherein the physical vapor deposition includes a sputtering deposition.

5. The method of claim 1, wherein forming the rare earth metal silicide film includes:
   forming a pre-rare earth metal silicide film on the exposed silicon region, and
   patterning the pre-rare earth metal silicide film.

6. The method of claim 5, wherein a composition of the rare earth metal silicide film and a composition of the pre-rare earth metal silicide film are substantially the same.

7. The method of claim 1, wherein the exposed silicon region is comprised in a source/drain region.

8. The method of claim 1, wherein the exposed silicon region is included in a gate electrode.

9. A method of fabricating a semiconductor device, comprising:
  forming a first gate electrode on a substrate;
  forming a first source/drain region at opposite sides of the first gate electrode;
  forming a rare earth metal silicide film on the first source/drain region, the rare earth metal silicide film contacting the first source/drain region; and
  forming a contact on the rare earth metal silicide film, the contact being electrically connected to the first source/drain region,
  wherein the rare earth metal silicide film is formed by sputtering a deposition target including rare earth metal silicide.

10. The method of claim 9, wherein the forming the rare earth metal silicide film includes:
  forming a pre-rare earth metal silicide film along a profile of the first gate electrode and an upper surface of the first source/drain region; and
  removing the pre-rare earth metal silicide film formed along the profile of the first gate electrode.

11. The method of claim 10, wherein the forming the contact includes:
  forming an interlayer insulating film on the rare earth metal silicide film and the first gate electrode; and
  forming a contact hole in the interlayer insulating film, the contact hole exposing the rare earth metal silicide film.

12. The method of claim 9, further comprising:
  forming an interlayer insulating film on the first source/drain region and the first gate electrode; and
  forming a contact hole in the interlayer insulating film, the contact hole exposing the first source/drain region,
  wherein the rare earth metal silicide film is formed on an upper surface of the first source/drain region and a sidewall of the contact hole.

13. The method of claim 9, wherein the rare earth metal silicide film is formed without thermal treatment.

14. The method of claim 9, wherein the substrate includes a n-type metal oxide semiconductor (NMOS) formation region and a p-type metal oxide semiconductor (PMOS) formation region, and
  wherein the first gate electrode and the first source/drain region are formed in the NMOS formation region.

15. The method of claim 14, further comprising:
  forming a second gate electrode on the substrate of the PMOS formation region;
  forming a second source/drain region at opposite sides of the second gate electrode; and
  forming a metal silicide film on the second source/drain region such that the metal silicide film contacts the second source/drain region,
  wherein the metal silicide film does not include the rare earth metal silicide.

16. A method of fabricating a semiconductor device comprising:
  forming a first gate electrode on a substrate;
  forming, at opposite sides of the first gate electrode, a first source/drain region having an exposed silicon region;
  forming a rare earth metal silicide film on the exposed silicon region by supplying a rare earth metal and a silicon to the exposed silicon region using physical vapor deposition; and
  forming a contact on the rare earth metal silicide film, the contact being electrically connected to the exposed silicon region via the rare earth metal silicide film.

17. The method of claim 16, wherein the rare earth metal silicide film is in contact with the exposed silicon region.

18. The method of claim 16, wherein the rare earth metal and the silicon are supplied simultaneously to the exposed silicon region.

19. The method of claim 16, wherein the forming the rare earth metal silicide film includes:
  forming a pre-rare earth metal silicide film along a profile of the first gate electrode and the exposed silicon region; and
  removing the pre-rare earth metal silicide film formed along the profile of the first gate electrode.

20. The method of claim 16, wherein the forming the contact includes:
  forming an interlayer insulating film on the rare earth metal silicide film and the first gate electrode;
  forming a contact hole in the interlayer insulating film, the contact hole exposing the rare earth metal silicide film; and
  filling the contact hole.

* * * * *